(12) United States Patent
Sato

(10) Patent No.: US 9,395,258 B2
(45) Date of Patent: *Jul. 19, 2016

(54) SEMICONDUCTOR PRESSURE SENSOR AND FABRICATION METHOD THEREOF

(71) Applicant: MITSUBISHI ELECTRIC CORPORATION, Tokyo (JP)

(72) Inventor: Kimitoshi Sato, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/154,813

(22) Filed: Jan. 14, 2014

(65) Prior Publication Data

US 2014/0319585 A1 Oct. 30, 2014

(30) Foreign Application Priority Data

Apr. 26, 2013 (JP) .................................. 2013-093681

(51) Int. Cl.
*G01L 9/00* (2006.01)
*H01L 29/84* (2006.01)
*H01L 27/06* (2006.01)
(Continued)

(52) U.S. Cl.
CPC ............ *G01L 9/0073* (2013.01); *B81C 1/00246* (2013.01); *B81C 1/00952* (2013.01); *G01L 9/0042* (2013.01); *H01L 27/0617* (2013.01); *H01L 29/84* (2013.01); *B81B 2201/0264* (2013.01); *B81C 2203/0714* (2013.01); *B81C 2203/0742* (2013.01); *H01L 27/0629* (2013.01); *H01L 27/11531* (2013.01)

(58) Field of Classification Search
CPC .... G01L 9/0073; H01L 29/84; G01P 15/0802
USPC .............................................. 257/254; 438/50
See application file for complete search history.

(56) References Cited

U.S. PATENT DOCUMENTS

| | | | | |
|---|---|---|---|---|
| 5,789,297 | A | * | 8/1998 | Wang et al. .................... 438/267 |
| 5,933,741 | A | * | 8/1999 | Tseng ................ H01L 21/28061 257/E21.2 |
| 6,472,243 | B2 | * | 10/2002 | Gogoi et al. ..................... 438/50 |

(Continued)

FOREIGN PATENT DOCUMENTS

| | | |
|---|---|---|
| JP | 2004-526299 A | 8/2004 |
| JP | 4267322 B2 | 2/2009 |

(Continued)

OTHER PUBLICATIONS

An Office Action; "Decision to Grant Patent," issued by the Japanese Patent Office on Apr. 5, 2016, which corresponds to Japanese Patent Application No. 2013-093681 and is related to U.S. Appl. No. 14/154,813; with English language translation.

*Primary Examiner* — Thao X Le
*Assistant Examiner* — Xia L Cross
(74) *Attorney, Agent, or Firm* — Studebaker & Brackett PC

(57) ABSTRACT

At a pressure sensor region, a pressure sensor including a fixed electrode, a vacuum chamber and a movable electrode is formed at a pressure sensor region, whereas a memory cell transistor and a field effect transistor are formed at a MOS region. An etching hole communicating with the vacuum chamber is sealed by a first sealing film and the like. The vacuum chamber is formed by removing a portion of a film identical to the film of a gate electrode of the memory cell transistor.

11 Claims, 30 Drawing Sheets

(51) Int. Cl.
  *B81C 1/00* (2006.01)
  *H01L 27/115* (2006.01)

(56) References Cited

U.S. PATENT DOCUMENTS

2002/0072144 A1  6/2002  Gogoi et al.
2005/0017313 A1* 1/2005  Wan .............................. 257/415
2010/0327883 A1* 12/2010 Reinmuth ..................... 324/681
2012/0187485 A1* 7/2012  Morioka ........................ 257/343
2012/0205653 A1* 8/2012  Nishikage ............. G01L 9/0045
                                                   257/49
2014/0159122 A1  6/2014  Sato

FOREIGN PATENT DOCUMENTS

JP    5504187 B2   5/2014
JP    5687202 B2   3/2015
JP    5832417 B2  12/2015

* cited by examiner

SEMICONDUCTOR PRESSURE SENSOR AND FABRICATION METHOD THEREOF

BACKGROUND OF THE INVENTION

1. Field of the Invention

The present invention relates to a semiconductor pressure sensor and a fabrication method thereof, particularly a semiconductor pressure sensor including a MOS circuit, and a method of fabricating such a semiconductor pressure sensor.

2. Description of the Background Art

In recent years, semiconductor pressure sensors are used in various fields such as in vehicles. One known type of a semiconductor pressure sensor is integrated with a complementary metal oxide semiconductor (MOS) circuit. A semiconductor pressure sensor disclosed in PTD 1 (Japanese National Patent Publication No. 2004-526299 (Japanese Patent No. 4267322)) will be described as such type of a semiconductor pressure sensor.

The semiconductor pressure sensor has a region where a MOS circuit is formed (MOS region) and a region where a pressure sensor is formed (pressure sensor region), defined at a semiconductor substrate. At the MOS region, an n-channel type MOS transistor and a p-channel type MOS transistor constituting a MOS circuit are formed.

At the pressure sensor region, a capacitive type pressure sensor is formed. The capacitive type pressure sensor includes a fixed electrode and a movable electrode, and has a vacuum chamber provided between the fixed electrode and the movable electrode. The vacuum chamber is sealed by a sealing film. The pressure is measured by detecting the change in the distance between the movable electrode and fixed electrode as a function of the capacitance value.

A conventional semiconductor pressure sensor has a problem set forth below. For the semiconductor pressure sensor, the step of forming a pressure sensor and the step of forming a MOS circuit are provided separately. In other words, the step of forming a sealing film to provide a vacuum chamber is additionally required as a dedicated step to producing a pressure sensor.

When a sacrifice film is to be removed by etching, a protection film for protecting the MOS region must be provided before that step, and the protection film must be removed after removal of the sacrifice film. Furthermore, in view of the vacuum chamber arranged below the movable electrode being formed prior to forming a metal interconnection at which the MOS region process is completed, sticking countermeasures are required to prevent the movable electrode from sticking caused by a wetting process or the like. This induces the problem that the fabrication process is lengthened and rendered complicated for a conventional semiconductor pressure sensor.

SUMMARY OF THE INVENTION

In view of the foregoing, an object of the present invention is to provide a semiconductor pressure sensor that can be fabricated readily. Another object of the present invention is to provide a method of fabricating a semiconductor pressure sensor intended to reduce the number of additional fabrication steps.

A semiconductor pressure sensor according to the present invention includes first and second regions, a pressure sensor, a memory cell transistor, an interlayer insulation film, a hole, a sealing portion, and an opening. The first and second regions are defined at a surface of a semiconductor substrate. The pressure sensor is formed at the first region, and includes a fixed electrode, a void, and a movable electrode. The void is located above the fixed electrode and the movable electrode is located above the void. The memory cell transistor is formed at the second region, and includes a first electrode and a second electrode arranged above the first electrode as a gate electrode. The interlayer insulation film is formed so as to cover the pressure sensor and the memory cell transistor. The hole is formed at the interlayer insulation film, communicating with the void. The sealing portion seals the void. The opening is formed at the interlayer insulation film, exposing the movable electrode. The fixed electrode is formed of a film identical to a conductor film qualified as the first electrode. The void is formed by removing a portion from a film identical to another conductor film qualified as the second electrode.

Another semiconductor pressure sensor according to the present invention includes first and second regions, a pressure sensor, a transistor, an interlayer insulation film, a hole, a sealing portion, and an opening. The first and second regions are defined at a surface of a semiconductor substrate. The pressure sensor is formed at the first region, and includes a fixed electrode, a void, and a movable electrode. The void is located above the fixed electrode. The movable electrode is located above the void. The transistor is formed at the second region, and includes a gate electrode. The interlayer insulation film is formed so as to cover the pressure sensor and transistor. The hole is formed at the interlayer insulation film, communicating with the void. The sealing portion seals the void. The opening is formed at the interlayer insulation film, exposing the movable electrode. The fixed electrode is a well region formed from the surface of the semiconductor substrate to a predetermined depth. The void is formed by removing a portion of a film identical to a conductor film qualified as the gate electrode.

A fabrication method of a semiconductor pressure sensor of the present invention includes the following steps. A first region where a pressure sensor is formed and a second region where a memory cell transistor is formed are defined at a surface of a semiconductor substrate. A fixed electrode is formed at the first region. A first conductor film is formed so as to cover the surface of the semiconductor substrate. By patterning the first conductor film, a first electrode qualified as a gate electrode of the memory cell transistor is formed at the second region. A second conductor film is formed so as to cover the fixed electrode and the first electrode. By patterning the second conductor film, a second conductor film pattern corresponding to the void is formed at the first region, and a second electrode is formed on the first electrode at the second region. A movable electrode is formed on the second conductor film pattern qualified as the void. An interlayer insulation film is formed so as cover the movable electrode, the first electrode, and the second electrode. A hole reaching the second conductor film pattern qualified as the void is formed at a region of the interlayer insulation film located at the first region. The void is formed by removing the second conductor film pattern qualified as the void. The hole communicating with the void is sealed. An opening exposing the movable electrode is formed at a portion of the interlayer insulation film located at the first region.

Another fabrication method of a semiconductor pressure sensor according to the present invention includes the following steps. A first region where a pressure sensor is to be formed and a second region where a transistor is to be formed are defined at a surface of a semiconductor substrate. A well region qualified as a fixed electrode is formed at the first region. A conductor film is formed so as to cover a surface of the semiconductor substrate. By patterning the conductor film, a conductor film pattern qualified as a void is formed at the first region, and a gate electrode of the transistor is formed at the second region. A movable electrode is formed on the conductor film pattern qualified as a void. An interlayer insulation film is formed so as to cover the movable electrode and gate electrode. A hole reaching the conductor film pattern qualified as a void is formed at a portion of the interlayer insulation film located at the first region. A void is formed by removing the conductor film pattern qualified as a void. The hole communicating with the void is sealed. An opening exposing the movable electrode is formed at a portion of the interlayer insulation film located at the first region.

A semiconductor pressure sensor according to the present invention can be readily fabricated in a manner having a memory cell transistor formed at a second region and a pressure sensor region formed at a first region.

According to another semiconductor pressure sensor of the present invention, a semiconductor pressure sensor can be readily fabricated in a manner having a transistor formed at a second region and a pressure sensor region formed at the first region.

According to the fabrication method of the semiconductor pressure sensor according to the present invention, a pressure sensor region can be readily fabricated at the first region, complying with the step of producing a memory cell transistor formed at the second region.

According to another fabrication method of a semiconductor pressure sensor of the present invention, a pressure sensor region can be produced readily at the first region, complying with the step of producing a transistor formed at the second region.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

A semiconductor pressure sensor and a fabrication method thereof according to a first embodiment will be described hereinafter starting from the fabrication method.

Figure 1:
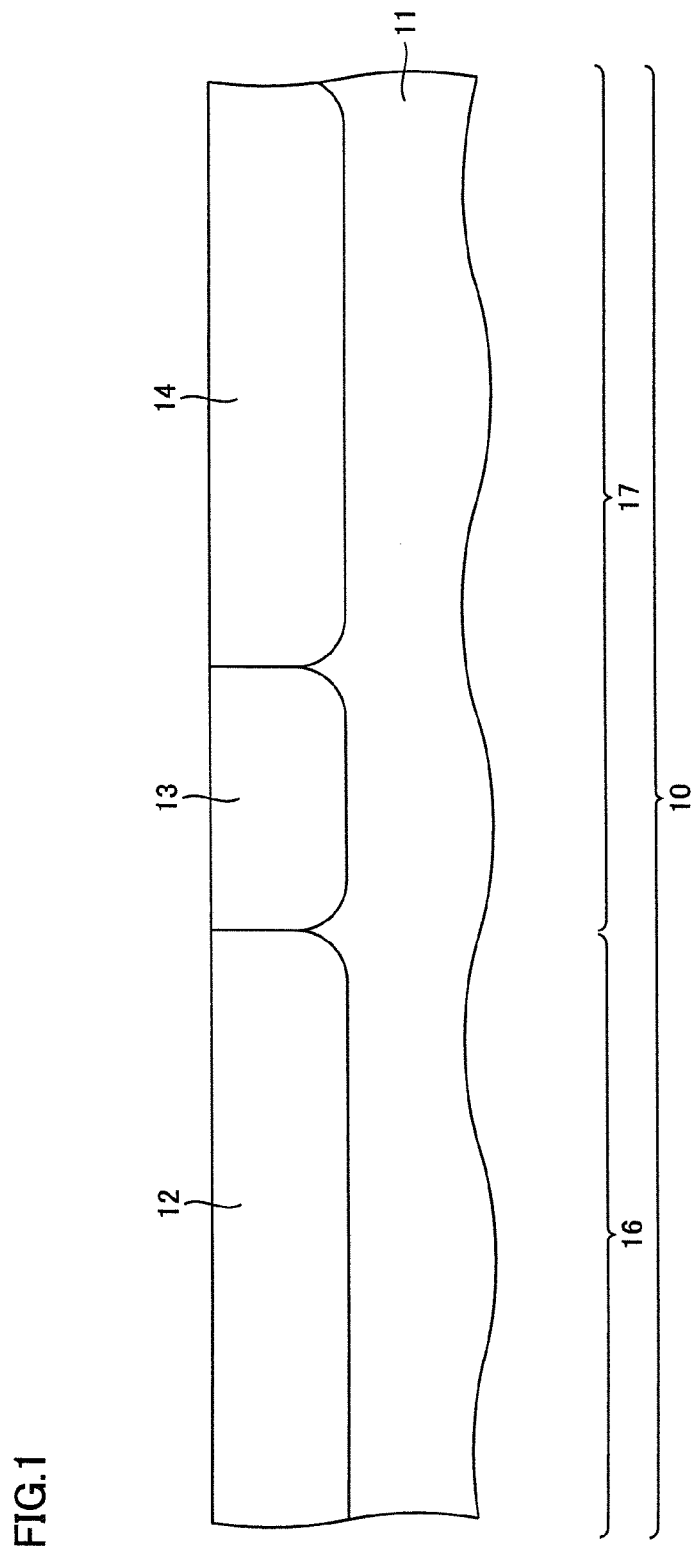
FIG. 1 is a sectional view representing a step in a fabrication method of a semiconductor pressure sensor according to a first embodiment of the present invention.

As shown in FIG. 1, the formation step starts by forming a first well region 12, a second well region 13, and a third well region 14, each of a predetermined conductivity type, at a pressure sensor region 16 where a pressure sensor is to be formed and a MOS region 17 where a MOS circuit is to be formed. In the formation step thereof, a p type silicon substrate, for example, is prepared. Then, a silicon oxide film and a silicon nitride film are sequentially formed so as to cover the silicon substrate. Next, a resist mask is formed, directed to removing the silicon nitride film located at the region where an NMOS transistor is to be formed in the MOS region.

By applying an etching process with that resist mask as an etching mask, the silicon nitride film is removed. Subsequently, using the resist mask that was employed as an etching mask now as an implantation mask, p type impurities (for example, boron) directed to forming a first well region 12 and a third well region 14 (refer to FIG. 1) are implanted. Then, the resist mask is removed.

By applying thermal oxidation, a silicon oxide film is formed at the region where the silicon nitride film was removed. Accordingly, a relatively thick silicon oxide film is formed at the surface of first well region 12 and third well region 14, followed by removal of the silicon nitride film. Then, using the relatively thick silicon oxide film as an implantation mask, n type impurities (for example, phosphorus) directed to forming a second well region 13 at the MOS region (refer to FIG. 1) are implanted.

Then, by applying annealing under a predetermined condition, the implanted p type impurities and n type impurities are activated to diffuse. Subsequently, the silicon oxide film remaining at the surface of the silicon substrate is removed. Thus, a first well region 12 of the p type is formed at pressure sensor region 16, as shown in FIG. 1. At MOS region 17, a second well region 13 of the n type and a third well region 14 of the p type are formed.

Figure 2:
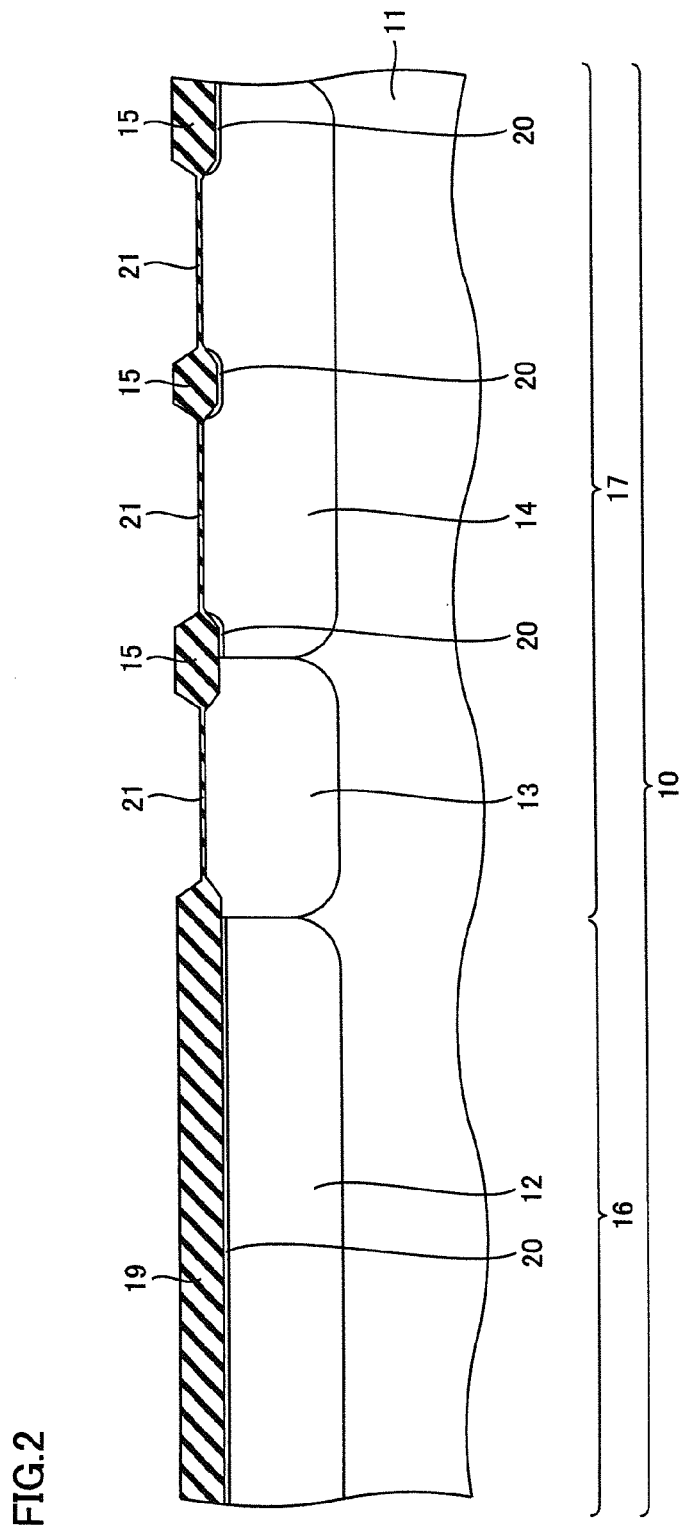
FIGS. 2-14 are sectional views representing a step performed after the step of a preceding drawing in the first embodiment.

The process proceeds to the step of forming field oxide films 15 and 19 shown in FIG. 2 by means of local oxidation of silicon (LOCOS), for example. At the surface of the silicon substrate, an underlying oxide film, a polysilicon film, and a silicon nitride film (all not shown) are sequentially formed. Then, by applying predetermined photolithography, a resist mask (not shown) directed to forming a field oxide film is provided.

By applying an etching process using the resist mask as an etching mask, the silicon nitride film corresponding to the region where the field oxide film is to be formed is removed. Subsequently, by applying photolithography again, a resist mask (not shown) directed to forming a channel stopper is provided. Using this resist mask as an implantation mask, p type impurities (for example, boron) are implanted to the region corresponding to a channel stopper. Then, the resist mask is removed.

Next, by applying oxidation under a predetermined condition, the area where the silicon nitride film is removed is locally oxidized to form field oxide films 15 and 19 (refer to FIG. 2). At this stage, the implanted p type impurities are activated to form a channel stopper 20 (refer to FIG. 2). Then, the remaining silicon nitride film is removed.

Thus, as shown in FIG. 2, field oxide film 19 is formed at pressure sensor region 16 whereas field oxide films 15 and 19 are formed at MOS region 17. Field oxide films 15 and 19 have a film thickness of approximately 0.2 to 1.0 Underlying oxide film 21 is located at the site where the silicon nitride film is removed. A semiconductor device such as a MOS transistor formed in the region defined by field oxide films 15 and 19 is electrically insulated from field oxide films 15 and 19 and channel stopper 20 formed right under thereof. Then, underlying oxide film 21 is removed.

Figure 3:
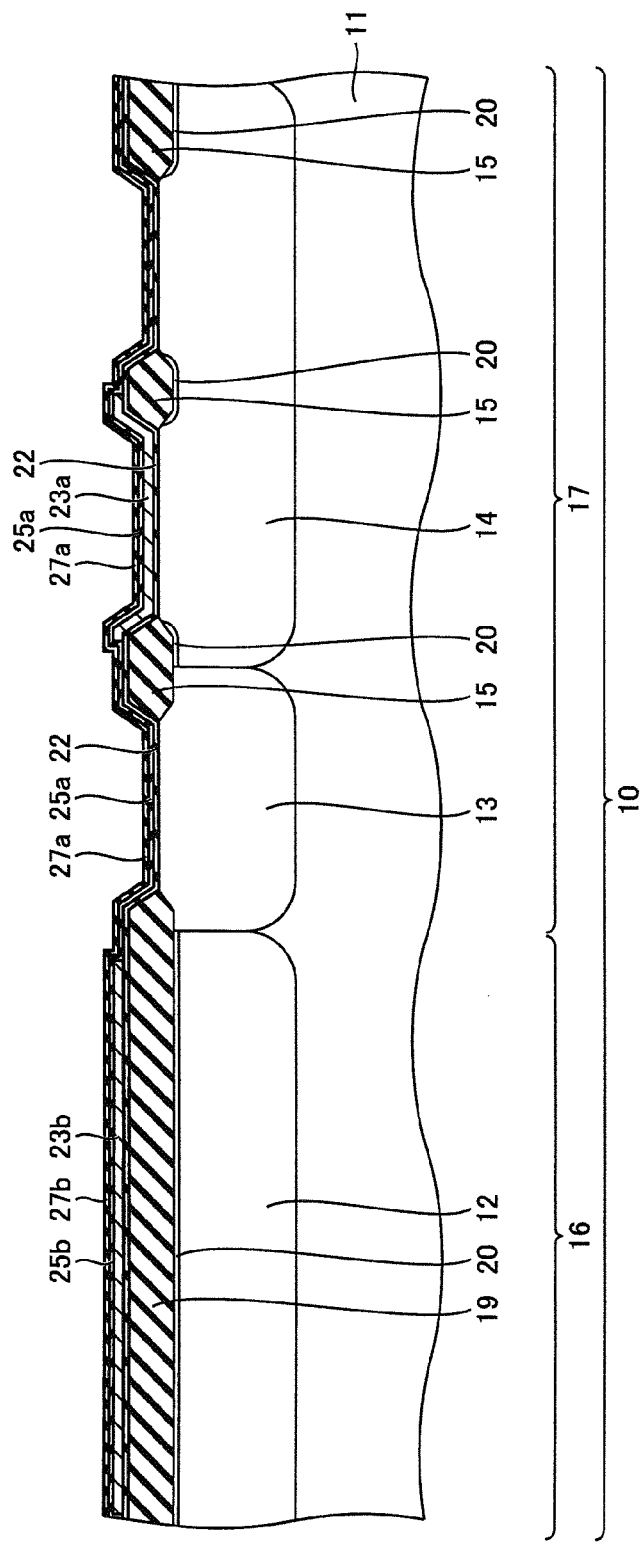

The process proceeds to the step shown in FIG. 3 where there are formed a fixed electrode 23b at pressure sensor region 16 and a floating gate electrode 23a of an EPROM (Erasable Programmable Read Only Memory) at MOS region 17, made of the same polysilicon film. First, the silicon substrate having the underlying oxide film removed is subjected to thermal oxidation. A first gate oxide film 22a (film thickness approximately 5-30 nm) is formed at the surface of exposed silicon substrate 11 at MOS region 17. This functions as a gate oxide film of an EPROM.

By chemical vapor deposition (CVD), a polysilicon film (not shown) is formed so as to cover first gate oxide film 22. At this stage, phosphorus is introduced by the well-known method during or immediately after formation of the polysilicon film to achieve the conductance as an n type polysilicon film. Then, photolithography is applied to form a resist mask directed to establishing a pattern of a fixed electrode and a floating gate.

By applying a predetermined etching process using the resist mask as an etching mask, fixed electrode 23b corresponding to the patterned polysilicon film is provided at pressure sensor region 16. On the part of MOS region 17, a pattern (film thickness approximately 50-300 nm) is established on a polysilicon film qualified as a floating gate electrode 23a of an EPROM. Subsequently, the resist mask is removed.

Then, by thermal oxidation, for example, a second gate oxide film 25a (film thickness approximately 5-30 nm) is formed so as to cover the pattern of the polysilicon film at MOS region 17 while a first fixed electrode protection film 25b made of the same film as the film qualified as the second gate oxide film is formed so as to cover fixed electrode 23b at pressure sensor region 16 simultaneously. By CVD, a first silicon nitride film 27a (film thickness approximately 5-30 nm) is deposited so as to cover second gate oxide film 25a at MOS region 17 while a second fixed electrode protection film 27b made of the same film as the film qualified as the first silicon nitride film is deposited at pressure sensor region 16 simultaneously. First fixed electrode protection film 25b and second fixed electrode protection film 27b function as a protection film of the movable electrode during removable of the sacrifice film through etching that will be described afterwards.

Then, a resist mask (not shown) is formed so as to expose second well region 13 where a p-channel MOS transistor is to be formed and cover the remaining region. Using this resist mask as an implantation mask, predetermined impurities (for example, phosphorus) directed to controlling the threshold voltage of a p type MOS transistor are implanted. Subsequently, the resist mask is removed. Also, a resist mask (not shown) is formed, exposing third well region 14 where an n-channel MOS transistor is to be formed, and covering the remaining region. Using this resist mask as an implantation mask, prescribed impurities (for example, boron) directed to controlling the threshold voltage of an n type MOS transistor are implanted. Subsequently, the resist mask is removed.

Then, a resist mask (not shown) is formed, exposing the region where a p-channel MOS transistor is to be formed at second well region 13 as well as the region where the n-channel MOS transistor is to be formed at third well region 14 in MOS region 17, and covering the remaining region. Using this resist mask as an etching mask, an etching process is applied to remove a region of first gate oxide film 22, a region of second gate oxide film 25a, and a region of first silicon nitride film 27a to expose a surface of silicon substrate 11. Subsequently, the resist mask is removed.

Figure 4:
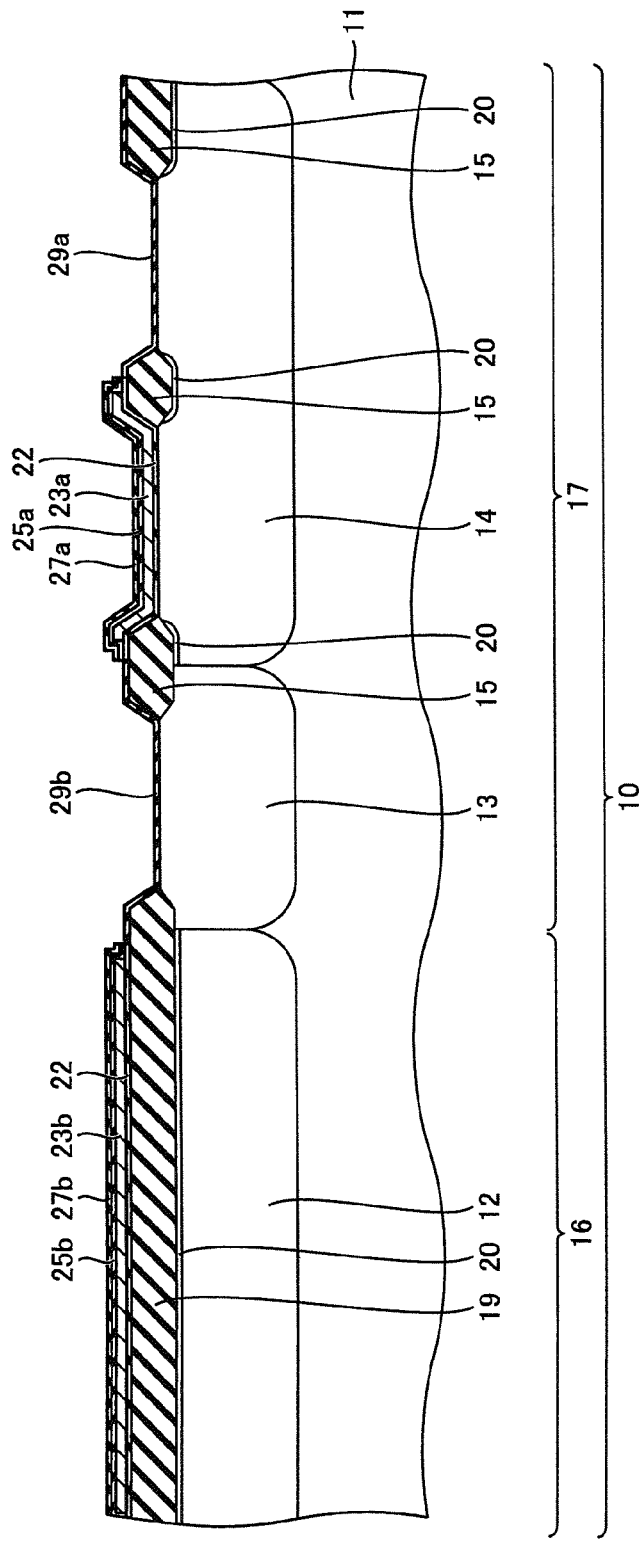

By thermal oxidation, a third gate oxide film 29b (film thickness approximately 5-30 nm) is formed at the surface of the region where a p-channel MOS transistor is to be formed at second well region 13, and a third gate oxide film 29a (film thickness approximately 5-30 nm) is formed at the surface of the region where an n-channel MOS transistor is to be formed at third well region 14, as shown in FIG. 4.

Figure 5:
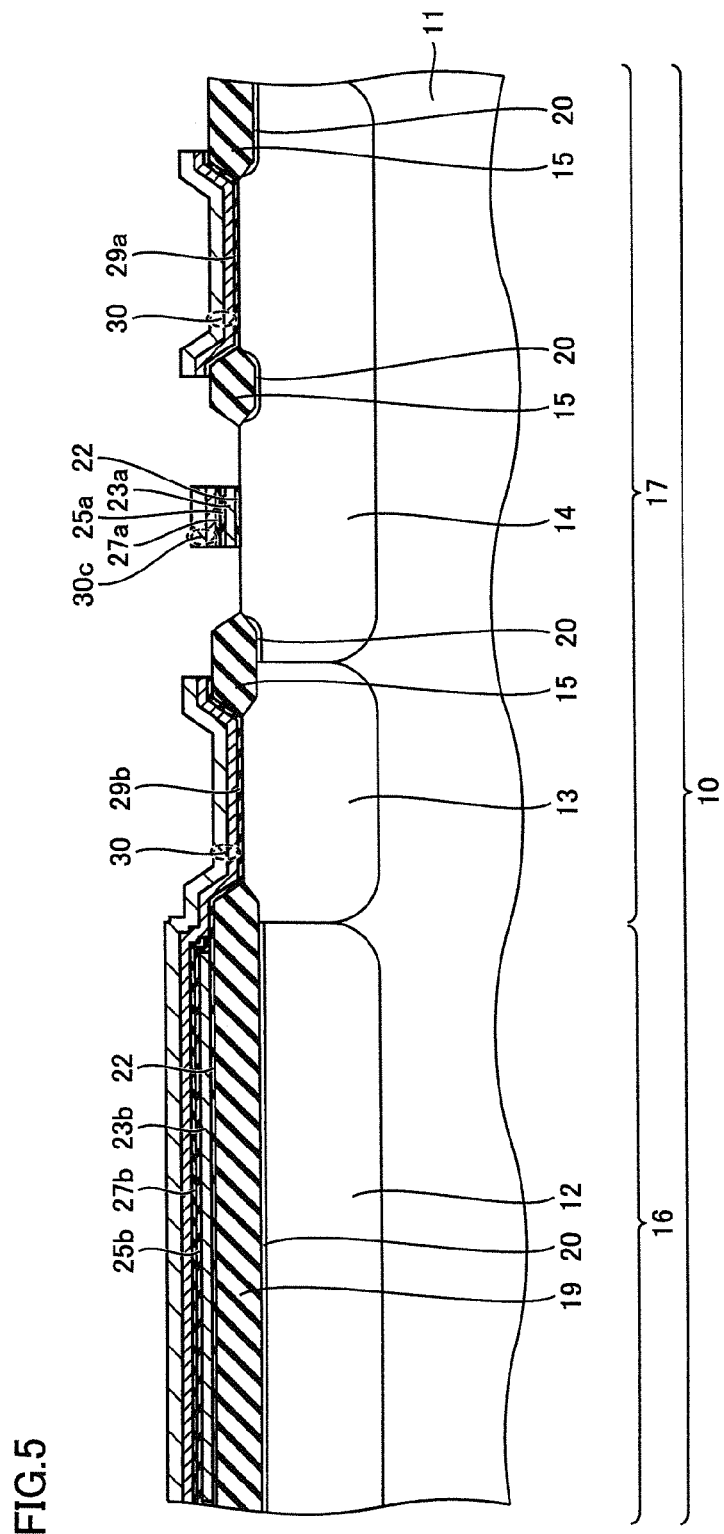

Then, the process proceeds to the step shown in FIG. 5 where there are to be formed a conductor film 30 qualified as gate electrodes 30a and 30b of p- and n-channel MOS transistors at MOS region 17, and a gate electrode 30c of an EPROM, made of the same material. First, a prescribed conductor film 30 (refer to FIG. 5) is formed so as to cover first silicon nitride film 27a, second fixed electrode protection film 27b and third gate oxide films 29a and 29b.

A stacked film of a two-layered structure including a polysilicon film (film thickness approximately 50-300 nm) and a tungsten silicide (WSi$_2$) film (film thickness approximately 50-300 nm), i.e. a polycide film, is formed as conductor film 30. The polysilicon film is formed by CVD, and set as an n type polysilicon film by having phosphorus introduced during or immediately after formation of the polysilicon film. The tungsten silicide film is formed by sputtering or CVD so as to cover the polysilicon film.

Then, a resist mask (not shown) directed to establishing a pattern of a gate electrode of an EPROM is formed. By etching using the resist mask as an etching mask, there is given a pattern of a gate electrode of an EPROM. At the EPROM (memory cell transistor) formation region in MOS region 17 shown in FIG. 5, conductor film 30, first silicon nitride film 27a, second gate oxide film 25a, the pattern on the polysilicon film and first gate oxide film 22 are etched to form the gate electrodes of an EPROM including a floating gate electrode 23a and a gate electrode 30c Following removal of the resist mask, n type impurities (for example, arsenic) are implanted using the gate electrodes as an implantation mask to form a first source/drain region 33. First source/drain region 33 corresponds to the EPROM shown in FIG. 6.

As will be described afterwards, a sacrifice film is formed by conductor film 30 directed to forming gate electrodes 30a and 30b of a MOS transistor and a gate electrode 30c of an EPROM at pressure sensor region 16.

Figure 6:
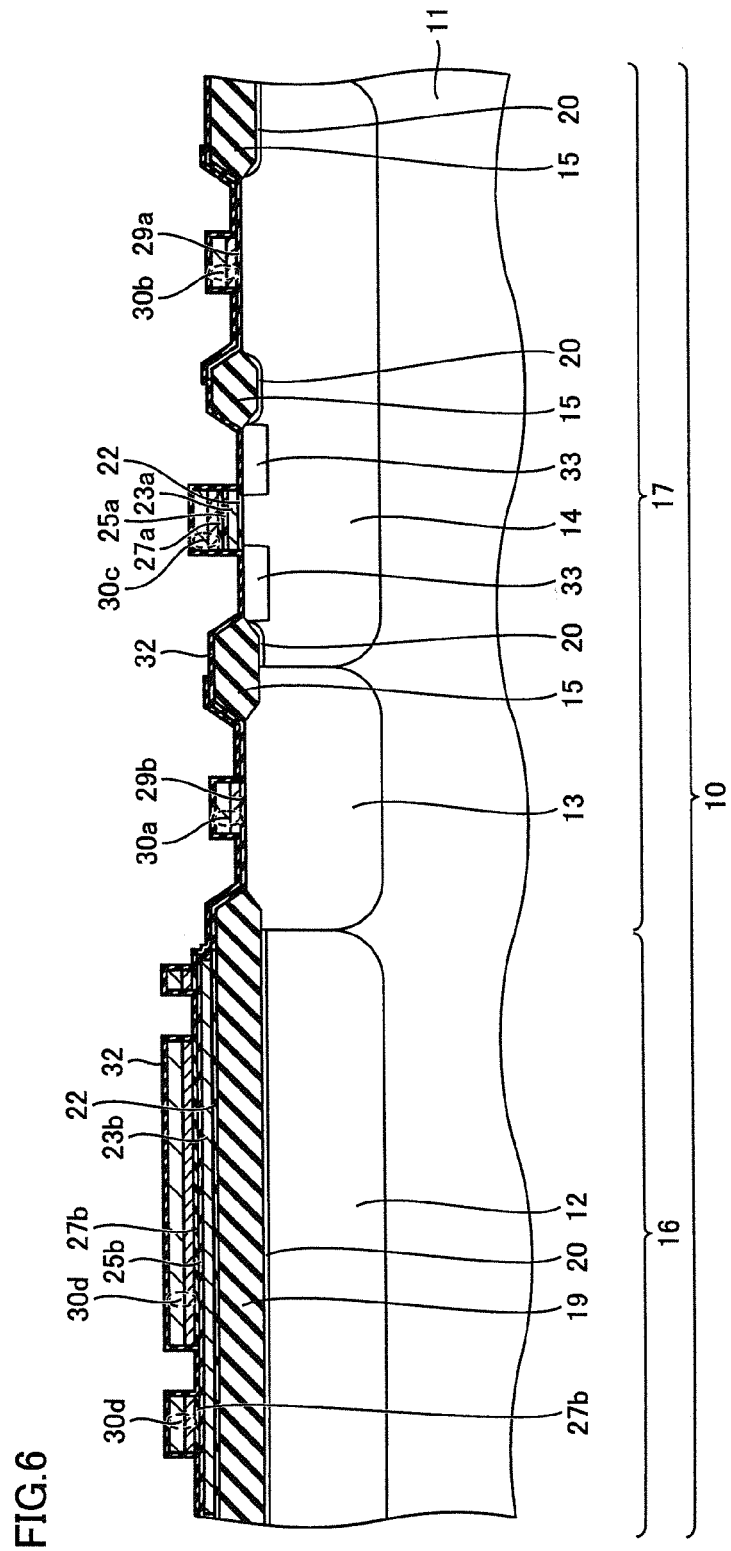

Then, a resist mask (not shown) directed to establishing a pattern of the gate electrode of a p-channel MOS transistor, the gate electrode of an n-channel MOS transistor, and the sacrifice film is formed. By etching conductor film 30 using the resist mask as an etching mask, a gate electrode 30b of an n-channel MOS transistor and a gate electrode 30a of a p-channel MOS transistor are formed at MOS region 17, as shown in FIG. 6. At pressure sensor region 16, a sacrifice film 30d is formed. Following removal of the resist mask, thermal treatment is applied under a predetermined condition to activate first source/drain region 33 and form a thin oxide film 32.

Thus, sacrifice film 30d is formed at the same time in the step of forming conductor film 30 corresponding to gate electrodes 30a, 30b and 30c, and the step of forming gate electrodes 30a and 30b by etching the provided conductor film. A vacuum chamber will be formed by removing this sacrifice film, as will be described afterwards. Thus, a first fixed electrode protection film 25b protecting fixed electrode 23b is formed at the same time as the step of forming second gate oxide film 25a. Furthermore, a second fixed electrode protection film 27b protecting the fixed electrode is formed at the same time as the step of forming first silicon nitride film 27a. The relationships of these steps imply that a dedicated step to form a pressure sensor is not required.

Then, a resist mask (not shown) is formed, exposing only the region where an n-channel MOS transistor is located, and covering the remaining region. By implanting n type impurities (for example, phosphorus) using the resist mask and gate electrode 30b as an implantation mask, an LDD (Lightly Doped Drain) region (refer to FIG. 7) is provided, followed by removal of the resist mask. Then, a TEOS (Tetra Ethyl Ortho Silicate glass) film (not shown), for example, is formed so as to cover gate electrodes 30a, 30b and 30c and sacrifice film 30d.

Figure 7:
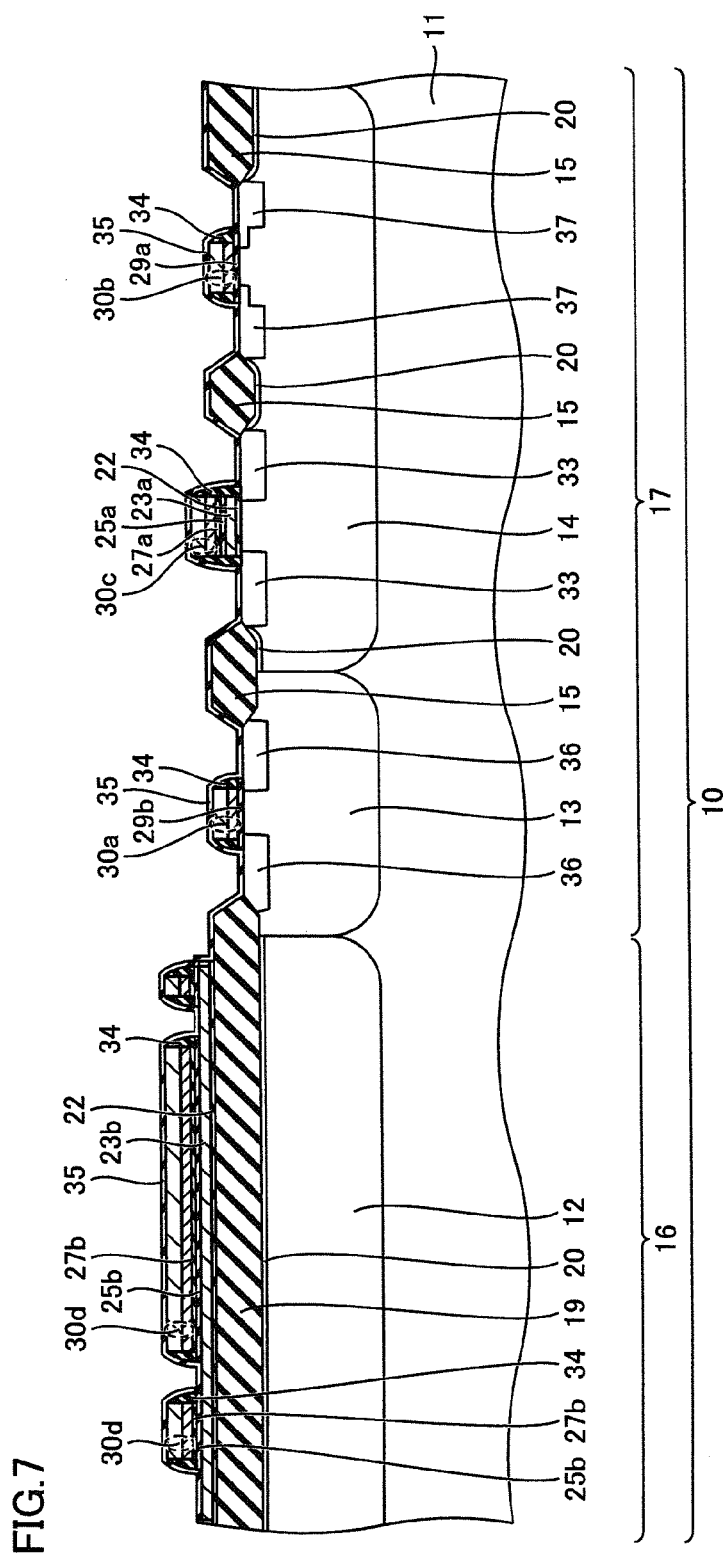

By applying anisotropic dry etching to the entire surface of the TEOS film, a sidewall oxide film 34 is formed at each sidewall face of gate electrodes 30a, 30b and 30c and sacrifice film 30d, as shown in FIG. 7. Formation of this sidewall oxide film serves to reduce the stepped portion around sacrifice film 30d. Moreover, stress concentration towards the edge of the movable electrode, when pressure is applied to the movable electrode can be alleviated by rounding the edge of the movable electrode supporting portion formed at a subsequent step.

Then, a resist mask (not shown) is formed at third well region 14, exposing the region where an n-channel MOS transistor is located, and covering the remaining region. By implanting n type impurities (for example, phosphorus) using that resist mask and gate electrode 30b as an implantation mask, a second source/drain region 37 is provided, followed by removal of that resist mask. Then, at second well region 13, a resist mask (not shown) is formed, exposing the region where a p-channel MOS transistor is formed, and covering the remaining region. By implanting p type impurities using that resist mask and gate electrode 30a as an implantation mask, a third source/drain region 36 is formed Following removal of that resist mask, annealing is applied under a predetermined condition to activate second source/drain region 37 and third source/drain region 36. By applying oxidation during this annealing, a thin oxide film 35 (approximately 3-20 nm in film thickness) is formed so as to cover gate electrodes 30a, 30b, 30c and sacrifice film 30d. FIG. 7 corresponds to the step of this stage.

Figure 8:
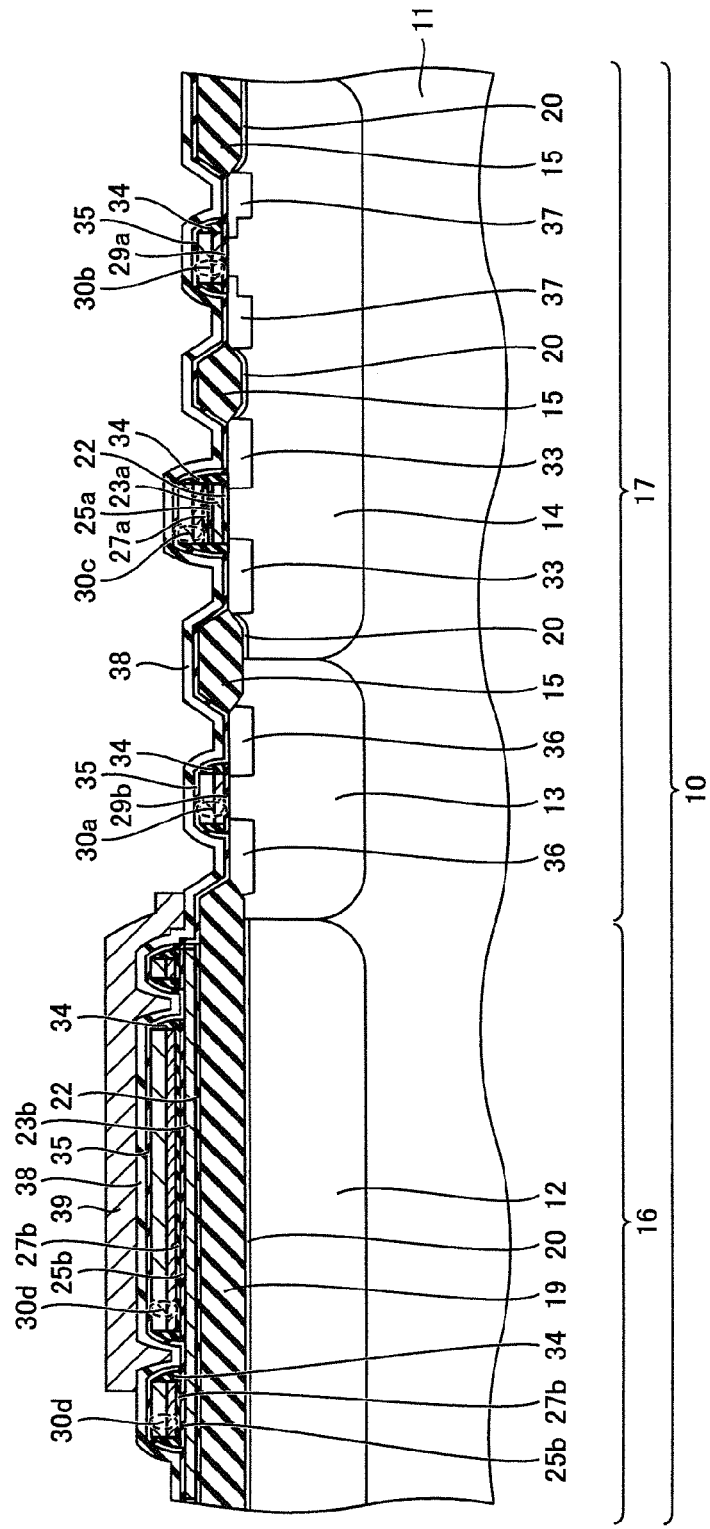

As shown in FIG. 8, a TEOS-based oxide film 38 is formed so as to cover oxide film 35. A conductive polysilicon film (not shown) qualified as a movable electrode is formed so as to cover oxide film 38. Then, photolithography is applied to form a resist mask (not shown) covering a portion of sacrifice film 30d and exposing the remaining region. By applying an etching process using that resist mask as an etching mask, the exposed polysilicon film is removed to form a movable electrode 39 covering a portion of sacrifice film 30d, as shown in FIG. 8. Then, the resist mask is removed.

The lessening of the stepped portion around sacrifice film 30d by virtue of sidewall oxide film 34 at this stage allows discontinuation of movable electrode 39 caused by a crack or insufficient coverage to be prevented and increase the degree of freedom in setting the film thickness of movable electrode 39. This movable electrode 39 is the most important diaphragm in the pressure sensor. The property of the pressure sensor is substantially determined by the processing condition of movable electrode 39.

First fixed electrode protection film 25b, second fixed electrode protection film 27b and sacrifice film 30d at pressure sensor region 16 are formed at the same time as the step of forming second gate oxide film 25a, first silicon nitride film 27a and gate electrodes 30a, 30b and 30c at MOS region 17. Furthermore, the thermal treatment condition is the same as the condition employed for the MOS transistor and the like formed at MOS region 17. Accordingly, while a significant modification may be restricted, the pressure sensor can be modified, complying with the specification of a semiconductor device such as a MOS transistor formed at the MOS region.

Further, by adjusting the film thickness of each movable electrode 39 and oxide film 38, the sensitivity property with respect to the initial capacitance value of movable electrode 39 (the amount of deflection of the movable electrode) can be regulated. Particularly, by adding the step of forming the most important movable electrode 39 as a dedicated step for forming the pressure sensor, the processing condition of movable electrode 39 can be set without affecting the property of the semiconductor device such as the MOS transistor formed at MOS region 17, allowing the property such as the sensitivity of the pressure sensor to be controlled. Movable electrode 39 has a film thickness of approximately 50-1000 nm.

Figure 9:
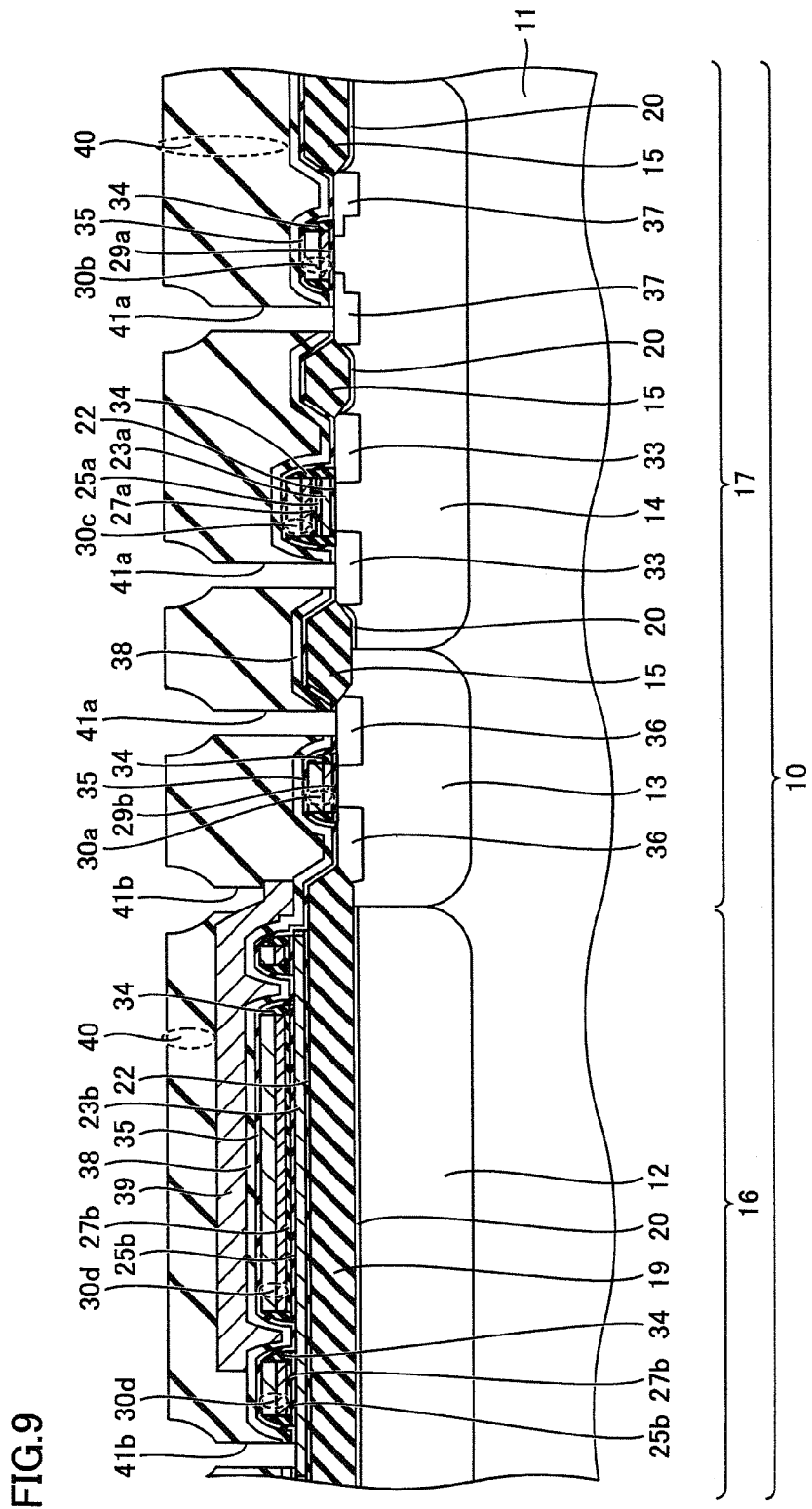

As shown in FIG. 9, a first interlayer insulation film 40 is formed so as to cover oxide film 38 and movable electrode 39. First interlayer insulation film 40 takes a stacked structure of a TEOS film, a BPSG (Boron Phosphorus Silicon Glass) film, and a TEOS film. The first interlayer insulation film is not limited to these films, and may employ another oxide film.

Oxide film 38 located at the interface between movable electrode 39 and sacrifice film 30d can be formed without changing first interlayer insulation film 40 at MOS region 17 by dividing the first interlayer insulation film and stacking the same. Thus, more steps of forming a MOS circuit can be applied as the step of forming a pressure sensor to facilitate the process. Furthermore, for planarizing first interlayer insulation film 40, an etch-back process may be applied to the BPSG film. Also, chemical mechanical polishing (CMP) may be applied.

Next, a resist mask (not shown) directed to forming a contact hole is provided by photolithography. Using the resist mask as an etching mask, an etching process is applied under a condition complying with the specification of the semiconductor device to be formed at MOS region 17. At MOS region 17, a contact hole 41a is formed through first interlayer insulation film 40 and the like, exposing first source/drain region 33, second source/drain region 37, third source/drain region 36, and the like. At pressure sensor region 16, a contact hole 41b exposing fixed electrode 23b and movable electrode 39 is formed, followed by removal of the resist mask. FIG. 9 corresponds to the step of this stage.

The etching process at this stage may be a combination of wet etching and dry etching to form contact holes 41a and 41b. In this case, contact holes 41a and 41b have a spread at the upper region of the opening, as shown in FIG. 9. Contact holes 41a and 41b may be formed by an etching process including only dry etching.

Figure 10:
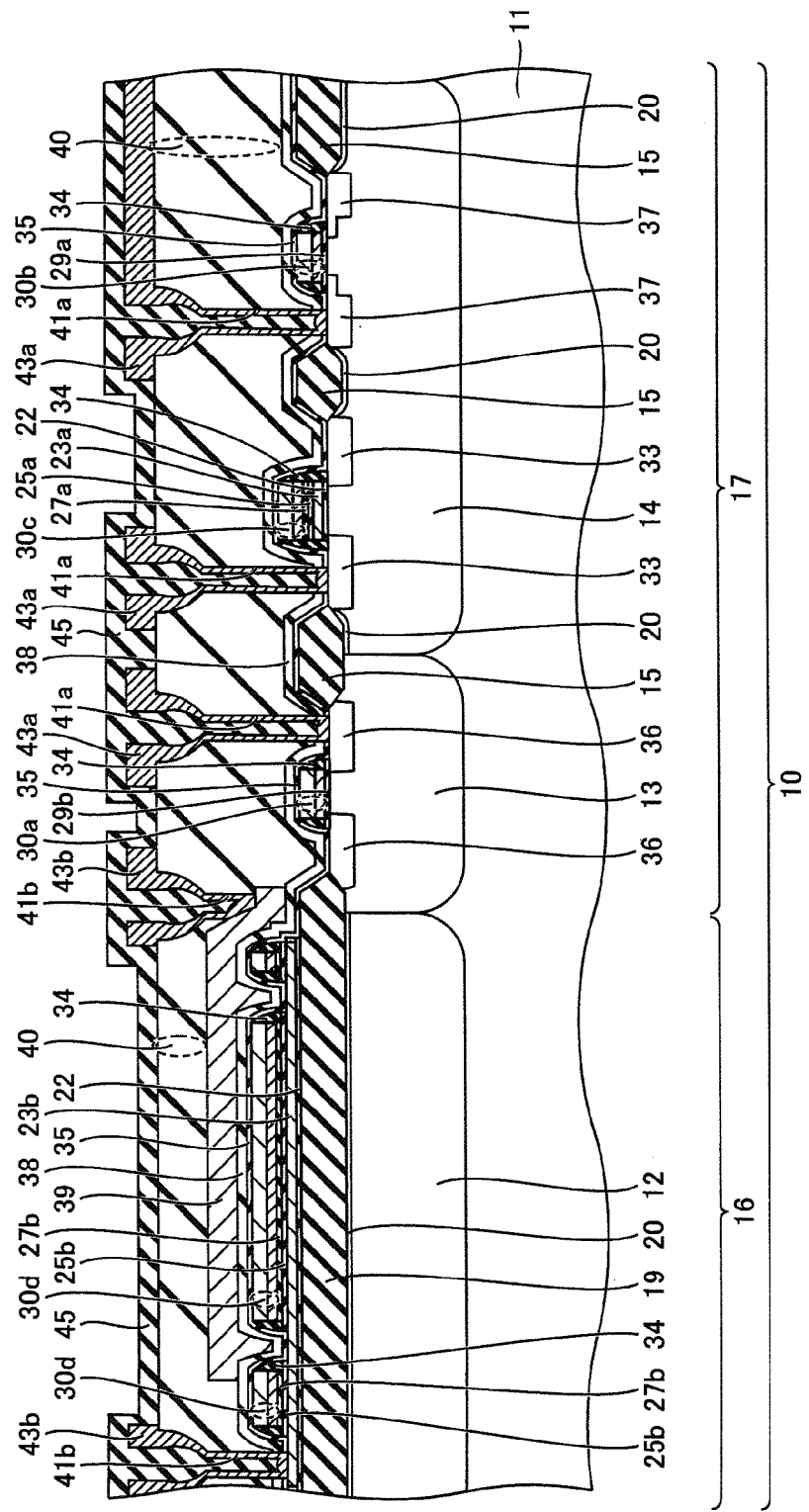

The process proceeds to the step shown in FIG. 10 where a first interconnection and a second interlayer insulation film covering the first interconnection are to be formed. First, a first interconnection and the like are formed using a metal film. A barrier metal film and an aluminium silicon copper (AlSiCu) film (both not shown) are formed so as to cover first interlayer insulation film 40. The barrier metal film includes, for example, a titanium nitride (TiN) film. By establishing a pattern on that aluminium silicon copper film and the like, a first interconnection 43a is formed at MOS region 17, and an interconnection 43b is formed at pressure sensor region 16.

Specifically, a resist mask is formed on the aluminium silicon copper film. The aluminium silicon copper film and barrier metal film are etched using the resist mask as an etching mask, followed by removal of the resist mask to form first interconnection 43a and interconnection 43b. First interconnection 43a is electrically connected to each of first source/drain region 33, second source/drain region 37, and third source/drain region 36. Interconnection 43b is electrically connected to fixed electrode 23b or movable electrode 39.

As the first interconnection and the like, a tungsten plug may be formed at contact holes 41a and 41b, followed by formation and patterning of the barrier metal and aluminium copper (AlCu) film. Suitable barrier metal in the case of such a configuration includes a titanium silicide ($TiSi_2$) or cobalt silicide ($CoSi_2$) film, and the like.

As shown in FIG. 10, a second interlayer insulation film 45 is formed so as to cover first interconnections 43a and interconnection 43b. For second interlayer insulation film 45, plasma TEOS formed by applying plasma CVD (hereinafter, referred to as "P-TEOS") is suitable. For planarization, a stacked film of a layered structure P-TEOS/SOG/P-TEOS including an SOG (Spin on Glass) film may be employed. CMP or an etchback process may be applied, likewise with the first interlayer insulation film.

By photolithography, a resist mask (not shown) directed to forming an etching hole is provided. By applying an etching process to the insulation film such as the second interlayer insulation film using the provided resist mask as an etching mask, an etching hole 46 directed to etching the sacrifice film is formed at pressure sensor region 16. Then, the resist mask is removed.

Figure 11:
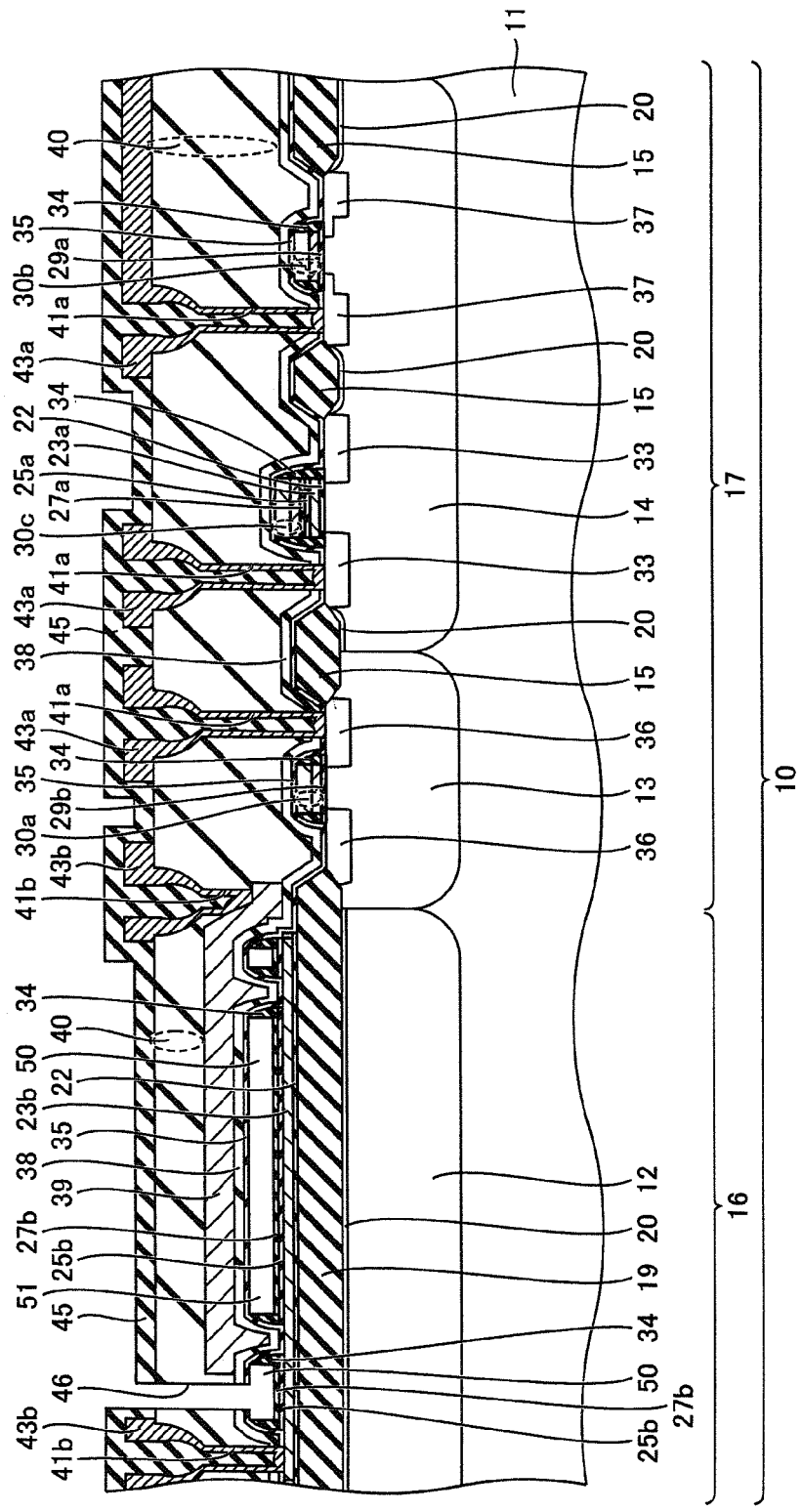

By applying etching through etching hole 46, sacrifice film 30d made of a two-layered structure of a polysilicon film and a tungsten silicide ($WSi_2$) film is removed. Accordingly, a void 50 is formed between movable electrode 39 and fixed electrode 23b. FIG. 11 corresponds to the step at this stage. For the etching process, wet etching is employed, and for the chemical agent, TMAH (Tetra Methyl Ammonium Hydroxide), for example, is employed.

In the etching process using the chemical agent (TMAH), the etching rate of the stacked polysilicon film and tungsten silicide ($WSi_2$) film constituting sacrifice film 30d is approximately 5000 to 10000 times the etching rate of the oxide film constituting second interlayer insulation film 45 and first interlayer insulation film 40 (etching selectivity ratio approximately 5000 to 10000). Therefore, the device formed at MOS region 17 and pressure sensor region 16 can be protected by second interlayer insulation film 45 and first interlayer insulation film 40 formed under a condition complying with the specification of the semiconductor device formed at the MOS region.

By etching sacrifice film 30d under the state where first interlayer insulation film 40 and second interlayer insulation film 45 are stacked on movable electrode 39, the movable electrode will be protected by a thick interlayer insulation film. Since the movable electrode is not deformed at this step, movable electrode 39 can be prevented from sticking. Furthermore, by forming a void at the latter half of the wafer process subsequent to formation of the interconnection, the handling during the process is facilitated. As to the treatment of removing sacrifice film 30d, dry etching applying xenon difluoride ($XeF_2$) or the like may be carried out other than wet etching.

Figure 12:
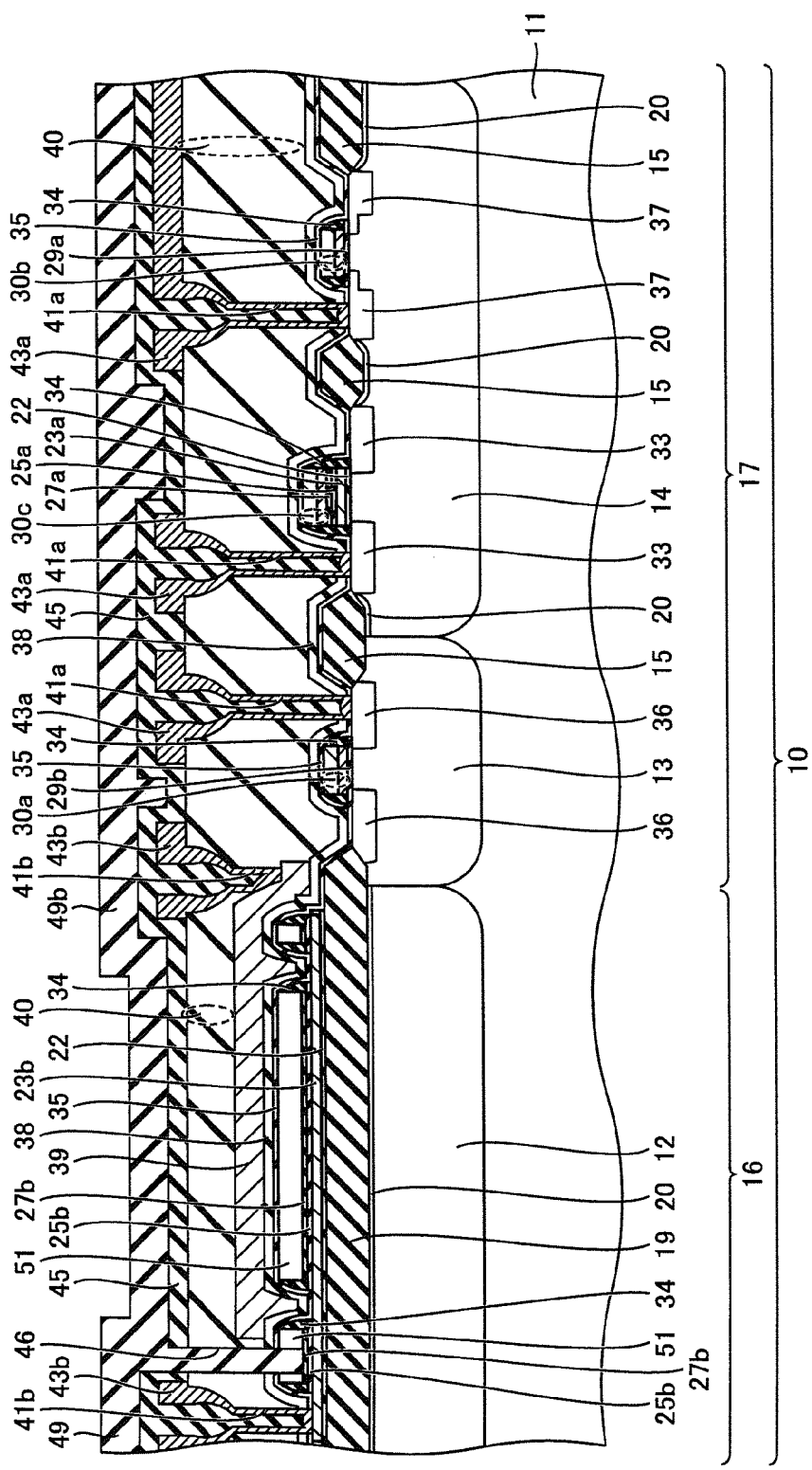

A process of setting void 50 formed by removing sacrifice film 30d as a vacuum chamber is carried out. First, by providing P-TEOS all over the surface by plasma CVD, likewise with forming second interlayer insulation film 45, a first sealing film 49 sealing etching hole 46 is formed. Since formation of a sealing film by plasma CVD is carried out under low pressure (several Torr), void 50 becomes a vacuum chamber 51 of several Torr. Further, third interlayer insulation film 49b is formed at MOS region 17. FIG. 12 corresponds to the step of this stage.

Figure 13:
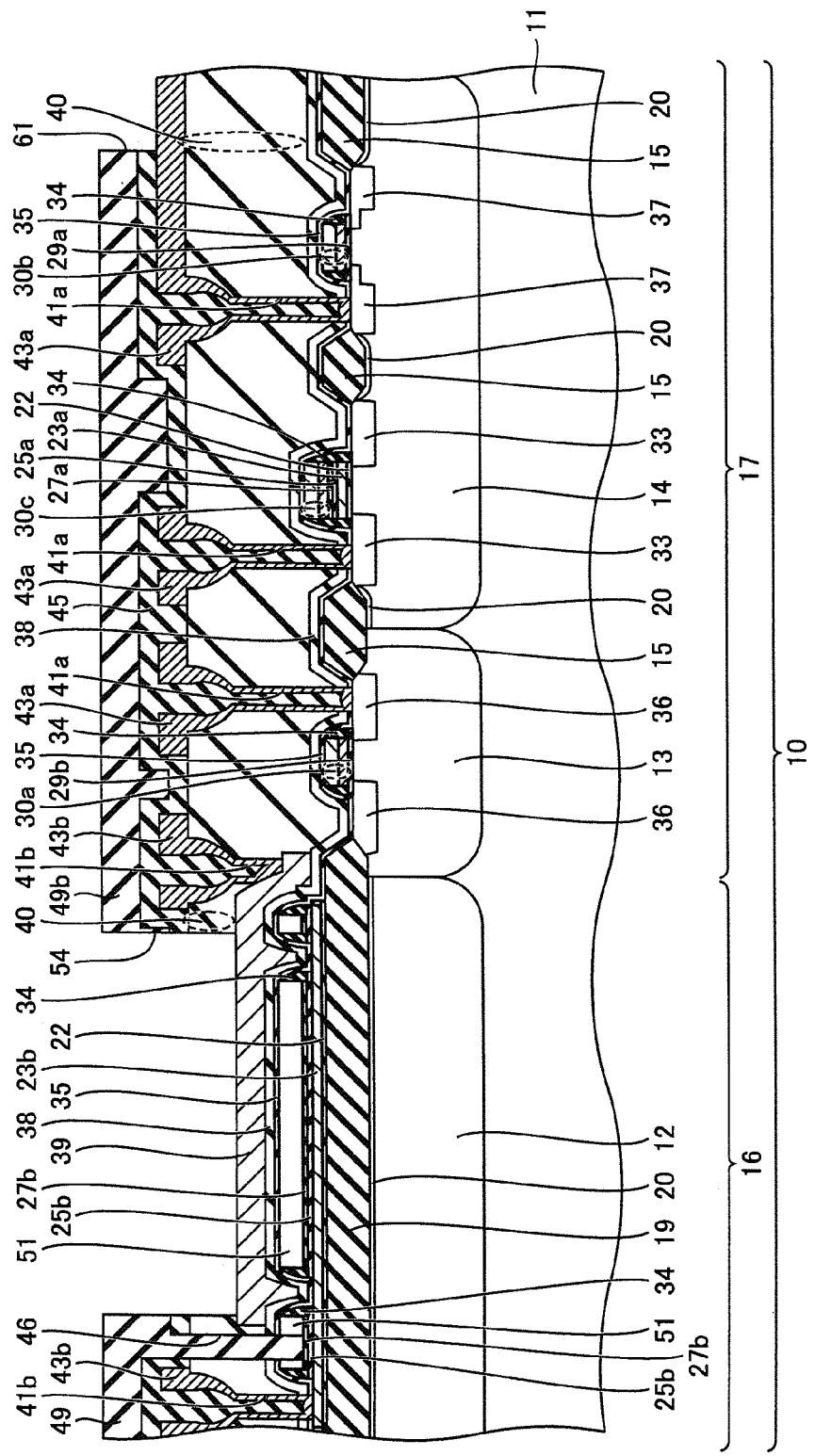

Then, a resist mask (not shown) exposing the region where an opening is formed is provided. Using this resist mask as an etching mask, an etching process of dry etching or a combination of dry etching and wet etching is applied, so that the portion of first sealing film 49, second interlayer insulation film 45 and first interlayer insulation film 40 located at the region where the opening of the pressure sensor is formed is removed at pressure sensor region 16. At MOS region 17, the portion of third interlayer insulation film 49b and second interlayer insulation film 45 located at the region where pad opening 61 is formed is removed. Accordingly, opening 54 of the pressure sensor is formed at pressure sensor region 16 in a state where movable electrode 39 is exposed. At MOS region 17, pad opening 61 is formed, corresponding to a state where first interconnection 43a is exposed. FIG. 13 corresponds to the step at this stage.

After the metal interconnection of first interconnection 43a and interconnection 43b is formed, the step of forming second interlayer insulation film 45 qualified as a surface protection film during etching of the sacrifice film, the step of opening an etching hole 46, and the step of forming first sealing film 49 and third interlayer insulation film 49b can be performed by applying the step of forming a through hole between a first layer metal interconnection and second layer metal interconnection of a general MOS process, allowing standardization. Therefore, pressure sensor region 16 can be formed without degrading the property of the semiconductor device such as a MOS transistor in MOS region 17, allowing formation of pressure sensor region 16.

Since many steps in the formation of a MOS circuit can be applied to the step of forming a pressure sensor, as will be described afterwards, formation of a predetermined portion for the pressure sensor at the same time of forming a MOS circuit can readily provide a pressure sensor having a MOS circuit integrated (MOS integrated circuit having a pressure sensor mounted).

Then, by plasma CVD, a silicon nitride film (not shown) qualified as a passivation film and having a film thickness of approximately 0.5 to 1.0 μm is formed so as to cover first sealing film 49 and third interlayer insulation film 49b under a condition complying with the specification of the semiconductor device formed at MOS region 17 (a relatively low temperature condition or the like).

Figure 14:
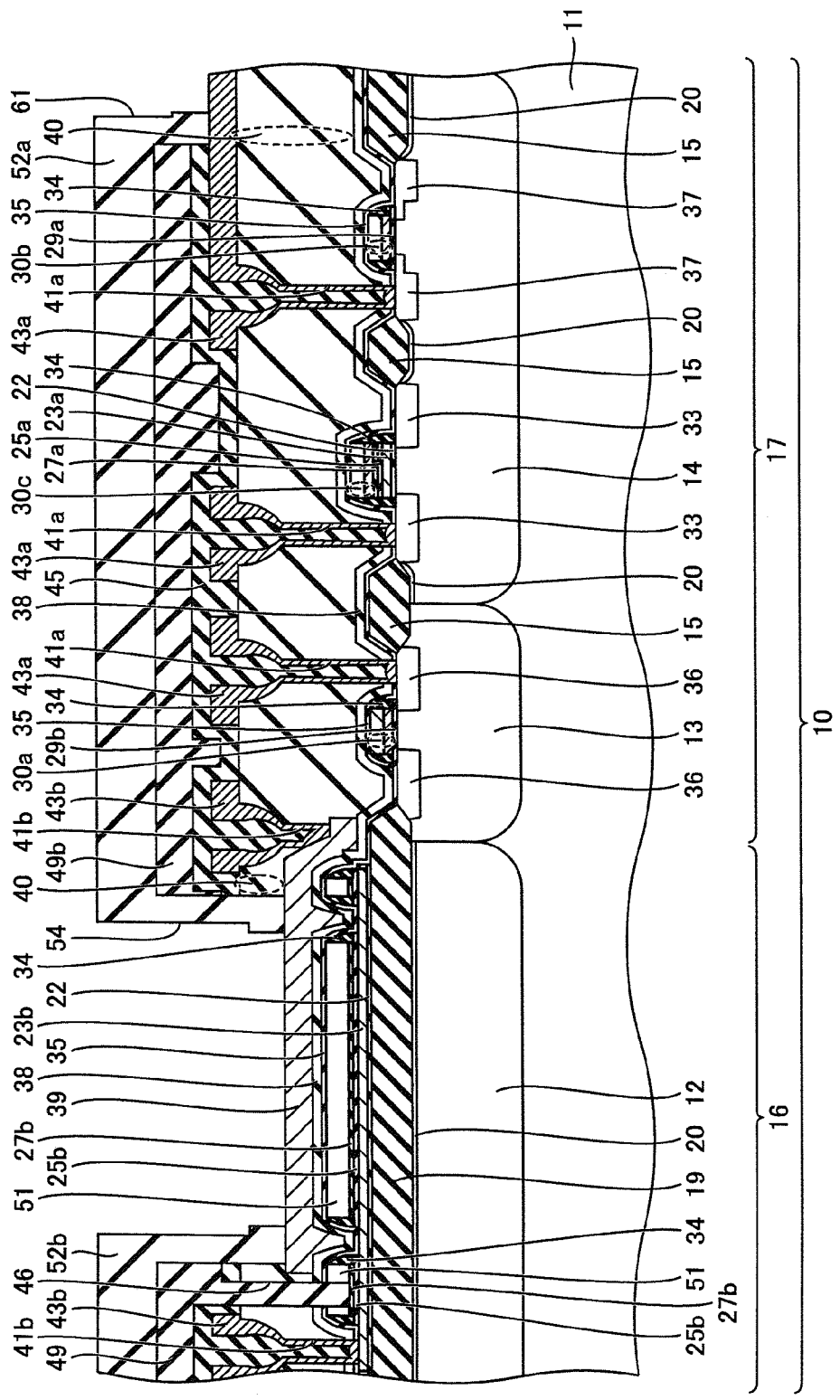
Figure 15:
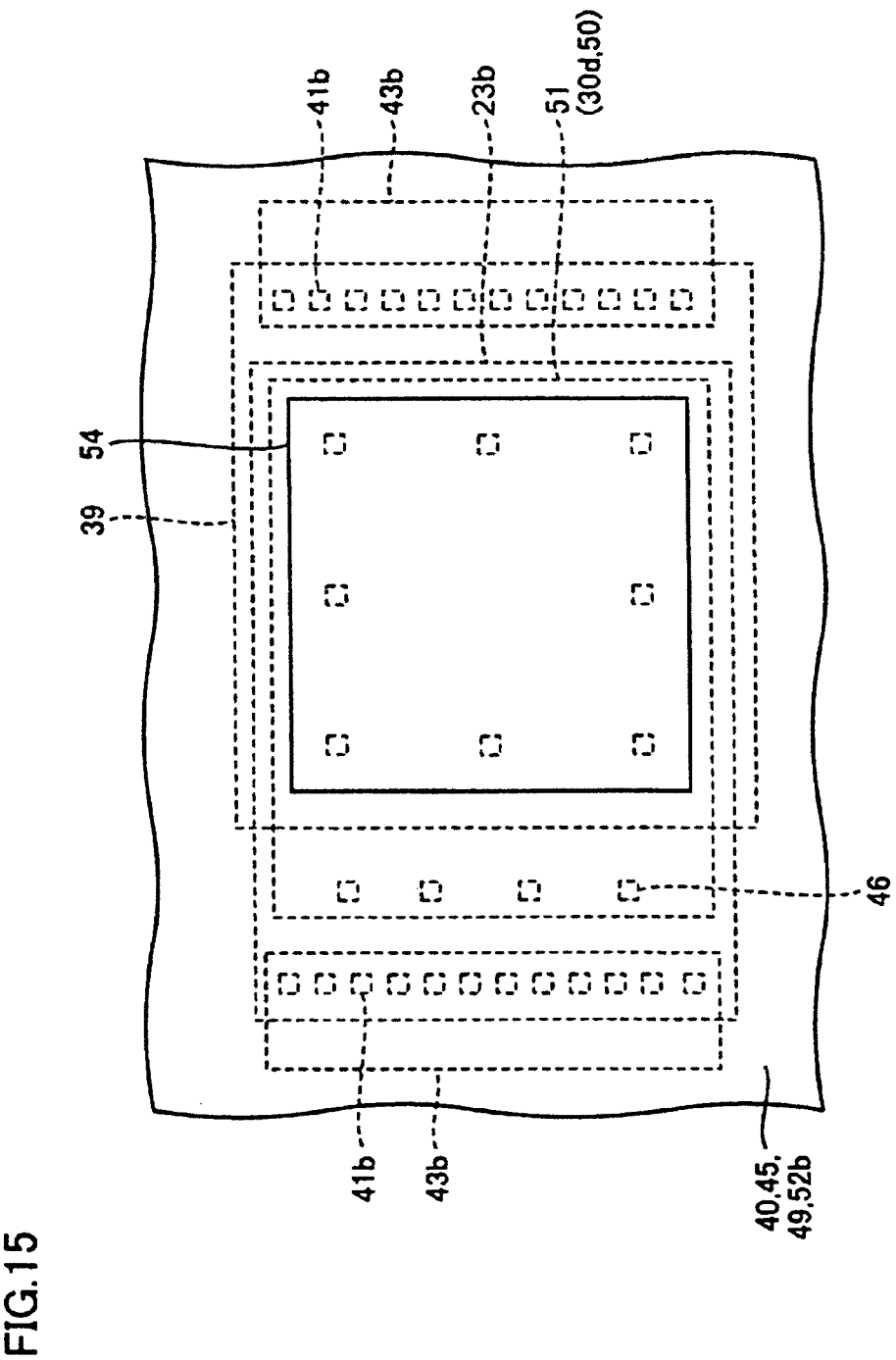
FIG. 15 is a partial plan view at the step of FIG. 14 in the first embodiment.

Then, a resist mask (not shown) exposing the portion of opening 54 of the pressure sensor at pressure sensor region 16 and exposing the portion of pad opening 61 at MOS region 17 is provided. By applying dry etching using the resist mask as an etching mask, the silicon nitride film located at the region where the opening is formed is removed. Accordingly, passivation film 52a is formed at MOS region 17. At pressure sensor region 16, a second sealing film 52b further sealing etching hole 46 is formed. Thus, by the double sealing of vacuum chamber 51 through first sealing film 49 and second sealing film 52b, vacuum sealing of high reliability is allowed. FIG. 14 corresponds to the step at this stage. FIG. 15 is a partial plan view of the pressure sensor region. Thus, the main portion of the semiconductor pressure sensor is formed.

In the method of fabricating a semiconductor pressure sensor set forth above, fixed electrode 23b is formed at the same time as the step of forming a polysilicon film qualified as a floating gate electrode 23a of an EPROM. First fixed electrode protection film 25b protecting fixed electrode 23b is formed at the same time as the step of forming second gate oxide film 25a. Second fixed electrode protection film 27b further protecting the fixed electrode is formed at the same time as the step of forming first silicon nitride film 27a. Sacrifice film 30d that provides vacuum chamber 51 by being removed is formed at the same time as the step of forming a double layered structure of a polysilicon film and a tungsten silicide ($WSi_2$) film constituting gate electrodes 30a, 30b and 30c. Second sealing film 52b is formed at the same time as the step of forming passivation film 52a.

Moreover, the handling during the fabrication process is facilitated since the sacrifice film etching and vacuum sealing steps in the pressure sensor formation step are performed subsequent to the formation of metal interconnection. Further, since the movable electrode is protected by a thick interlayer oxide film after a void has been formed by removing the sacrifice film through etching and until vacuum sealing is implemented, there are the advantages that sticking can be prevented and handling is facilitated. Furthermore, the step of surface protection at the time of sacrifice film etching, opening an etching hole, and forming a vacuum sealing film can be performed by applying a through hole step common to the MOS process, allowing standardization. Thus, many steps of forming a semiconductor device such as a MOS transistor in the MOS region can be applied as the step of forming a pressure sensor to facilitate the fabrication of a semiconductor pressure sensor integrated with a MOS circuit incorporating an EPROM.

A movable electrode that is most important in the property of a semiconductor pressure sensor is added in a dedicated step of forming a semiconductor pressure sensor. By providing a degree of freedom such as in thickness setting, and by forming a sidewall oxide film with respect to the sacrifice film under the movable electrode, the edge portion of the movable electrode becomes blunt, allowing the stress to be alleviated when the movable electrode is deflected by pressure being applied thereto. Thus, the reliability as a semiconductor pressure sensor is improved.

In the semiconductor pressure sensor set forth above, the surface side of movable electrode 39 at pressure sensor region 16 is open towards the outside space via opening 54, so that movable electrode 39 is deformed corresponding to the outer pressure to cause change in the distance (gap) between fixed electrode 23b and movable electrode 39. By detecting this change in distance as a change in the capacitance in a semiconductor pressure sensor, measurement of the pressure value is obtained. By taking the pressure in vacuum chamber 51 located immediately below movable electrode 39 as the reference pressure, this semiconductor pressure sensor may be implemented as an absolute pressure sensor.

In other words, the above-described semiconductor pressure sensor is of the capacitive type that measures a change in the capacitance as a pressure value. The capacitance value corresponds to change in the distance between movable electrode 39 and fixed electrode 23b, measured as the pressure value. More accurately, the capacitance value is the sum (total value) of each capacitance value of first fixed electrode protection film 25b and second fixed electrode protection film 27b located between fixed electrode 23b and vacuum chamber 51 (capacitance value A and capacitance value B), the capacitance value of oxide films 35 and 38 located between movable electrode 39 and vacuum chamber 51 (capacitance value C), and the capacitance value of vacuum chamber 51 (capacitance value D). Since only capacitance value D of vacuum chamber 51 varies depending upon the external pressure, the initial capacitance values of each of A-C (initial value) must be identified precisely in order to measure the pressure value more accurately.

However, it is difficult to properly identify the initial value of capacitance B of second fixed electrode protection film 27b due to variation of the film thickness in forming first silicon nitride film 27a qualified as second fixed electrode protection film 27b, and variation in the reduced amount of second fixed electrode protection film 27b during removal of sacrifice film 30d by etching. Moreover, it is difficult to properly identify the initial value of capacitance A of first fixed electrode protection film 25b due to variation of the film thickness in forming second gate oxide film 25a qualified as first fixed electrode protection film 25b.

It is also difficult to properly identify the initial value of capacitance C due to the variation in the film thickness in forming oxide films 35 and 38 at pressure sensor region 16 qualified as a movable electrode protection film and due to variation in the reduced amount of oxide films 35 and 38 at pressure sensor region 16 during removal of sacrifice film 30d by etching. Furthermore, it is difficult to properly identify the initial value of capacitance D due to the variation in the film thickness in forming gate electrode 30c qualified as sacrifice film 30d at vacuum chamber 51 that changes according to the external pressure.

Figure 16:
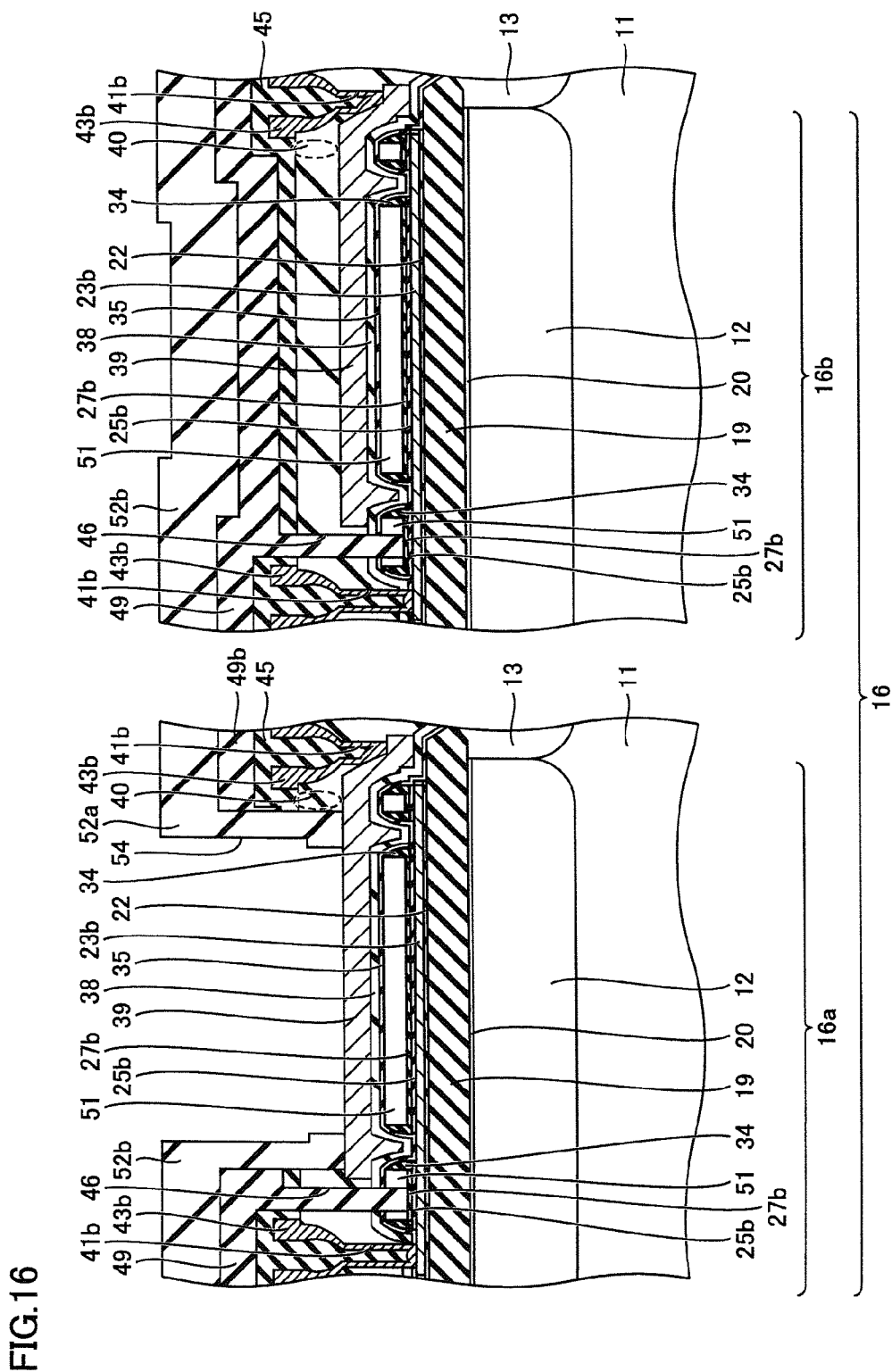
FIG. 16 is a partial sectional view of a detection-oriented pressure sensor region and a reference-oriented pressure sensor region in the first embodiment.

The method of arranging a reference-oriented pressure sensor region 16b absent of an opening in the proximity of a detection-oriented pressure sensor region 16a with opening 54 formed at pressure sensor region 16, as shown in FIG. 16, will be described hereinafter for the purpose of canceling such variation in the initial values.

At reference-oriented pressure sensor region 16b, first interlayer insulation film 40 and second interlayer insulation film 45 remain so as to cover movable electrode 39. Also, first sealing film 49 and second sealing film 52b are provided so as to cover movable electrode 39. Accordingly, the distance between movable electrode 39 and fixed electrode 23b does not change readily in response to change in the external pressure at reference-oriented pressure sensor region 16b. By subtracting a change in the capacitance value of the reference-oriented pressure sensor from the change in the capacitance value of the detection-oriented pressure sensor, variation in the initial values of capacitance values A-D can be canceled. As a result, measurement of a pressure value can be achieved at high accuracy.

The reference-oriented pressure sensor may be configured to prohibit variation in the movable electrode even if the external pressure changes by providing a plurality of anchors below the movable electrode to fix the movable electrode. Although the pressure sensor indicated in FIG. 15 has a stacked structure including first interlayer insulation film 40, second interlayer insulation film 45, first sealing film 49 and second sealing film 52b layered on movable electrode 39, a similar advantage can be obtained even by a stacked structure including only first interlayer insulation film 40, second interlayer insulation film 45, and first sealing film 49.

Modification

In the semiconductor pressure sensor set forth above, a metal interconnection of a single layer was described by way of example as a metal interconnection of MOS region 17. As a modification, the fabrication flow when the metal interconnection of MOS region 17 is a two layered metal interconnection will be described. Description will be provided only schematically since there is no great difference from a metal interconnection of a single layer. Elements similar to those in the semiconductor pressure sensor set forth above have the same reference characters allotted, and description thereof will not be repeated unless otherwise necessary.

Figure 17:
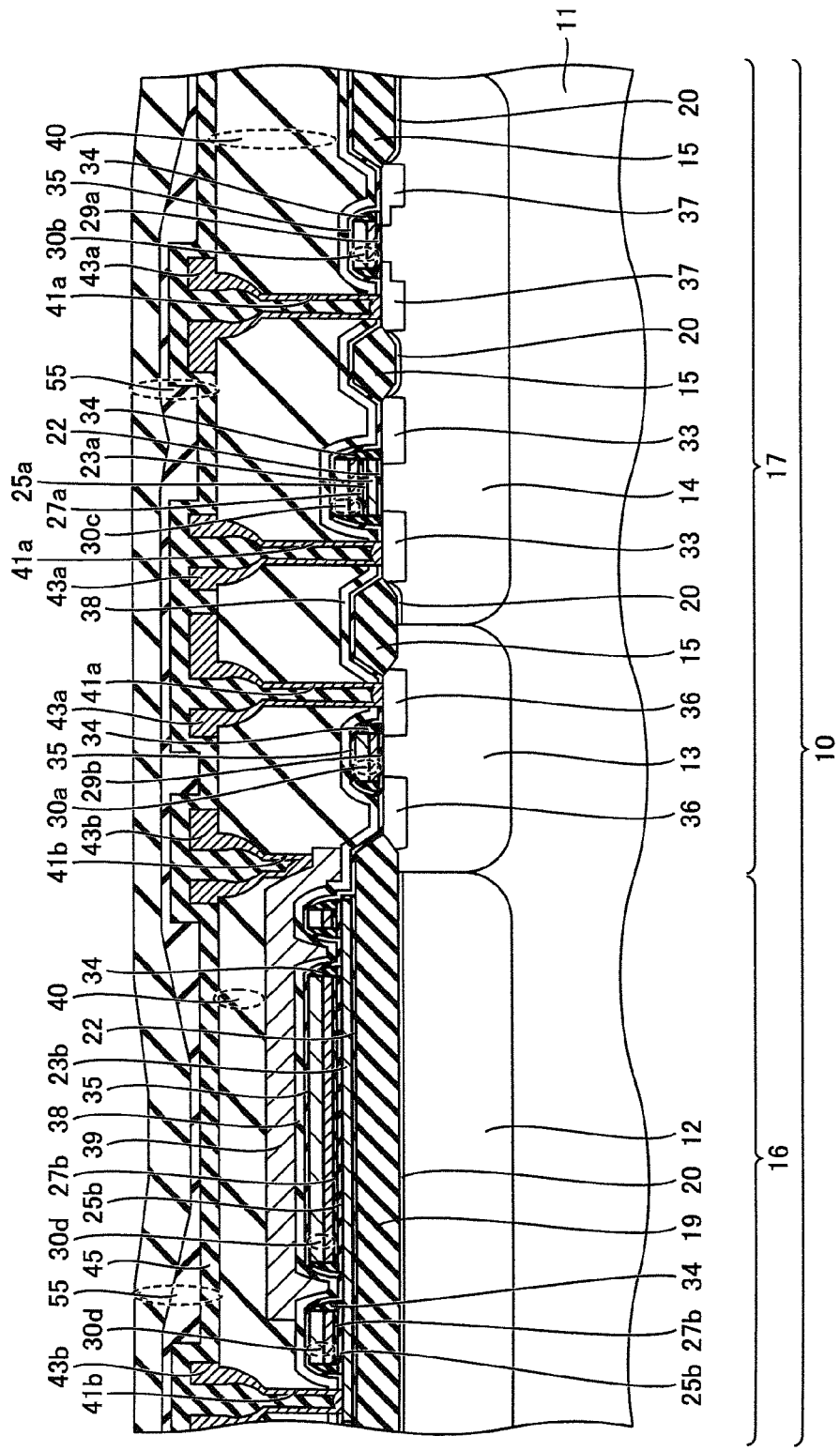
FIG. 17 is a sectional view representing a step in a fabrication method of a semiconductor pressure sensor according to a modification of the first embodiment of the present invention.

Subsequent to the steps similar to those shown in FIGS. 1-9, first interconnection 43a is formed at MOS region 17 whereas interconnection 43b is formed at pressure sensor region 16, as shown in FIG. 17. Interlayer oxide film 55 is formed so as to cover first interconnection 43a and interconnection 43b. For interlayer oxide film 55, a P-TEOS film, for example, or the like is suitable. For planarization, a stacked structure of P-TEOS/SOG/P-TEOS including a SOG film may be employed. Moreover, likewise with first interlayer insulation film 40, CMP and/or an etchback process may be applied as the planarization process. FIG. 16 corresponds to the step of this stage.

Figure 18:
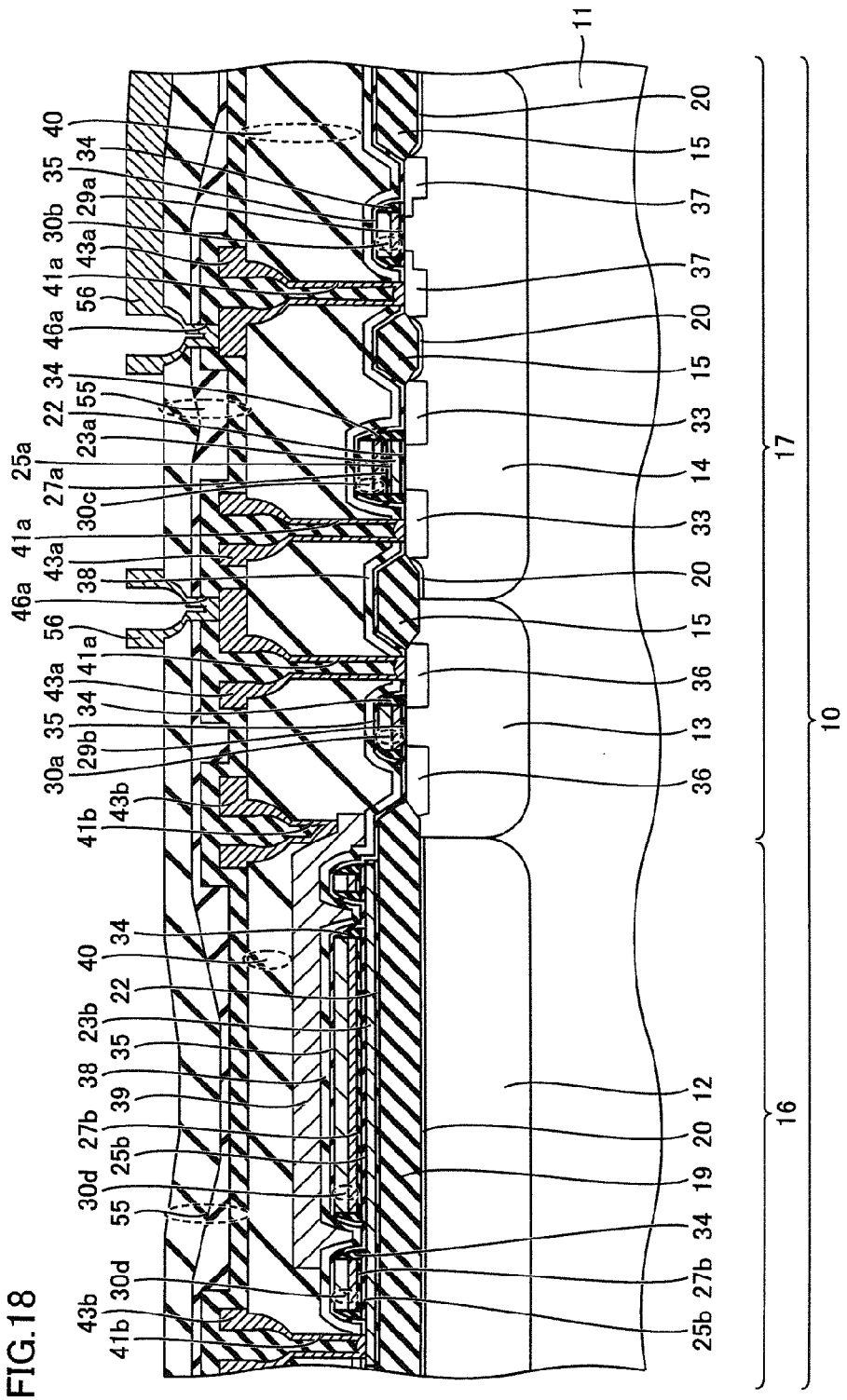
FIGS. 18-21 are sectional views representing a step performed after the step of a preceding drawing in the modification of the first embodiment.

By applying photolithography, a resist mask (not shown) directed to forming a through hole is provided. Using that resist mask as an etching mask, interlayer oxide film 55 is subjected to etching, whereby a through hole 46a exposing first interconnection 43 is formed at MOS region 17, as shown in FIG. 18. By a process similar to that of first interconnection 43, a second interconnection 56 constituting the second patterned layer of the metal interconnection is formed.

Figure 19:
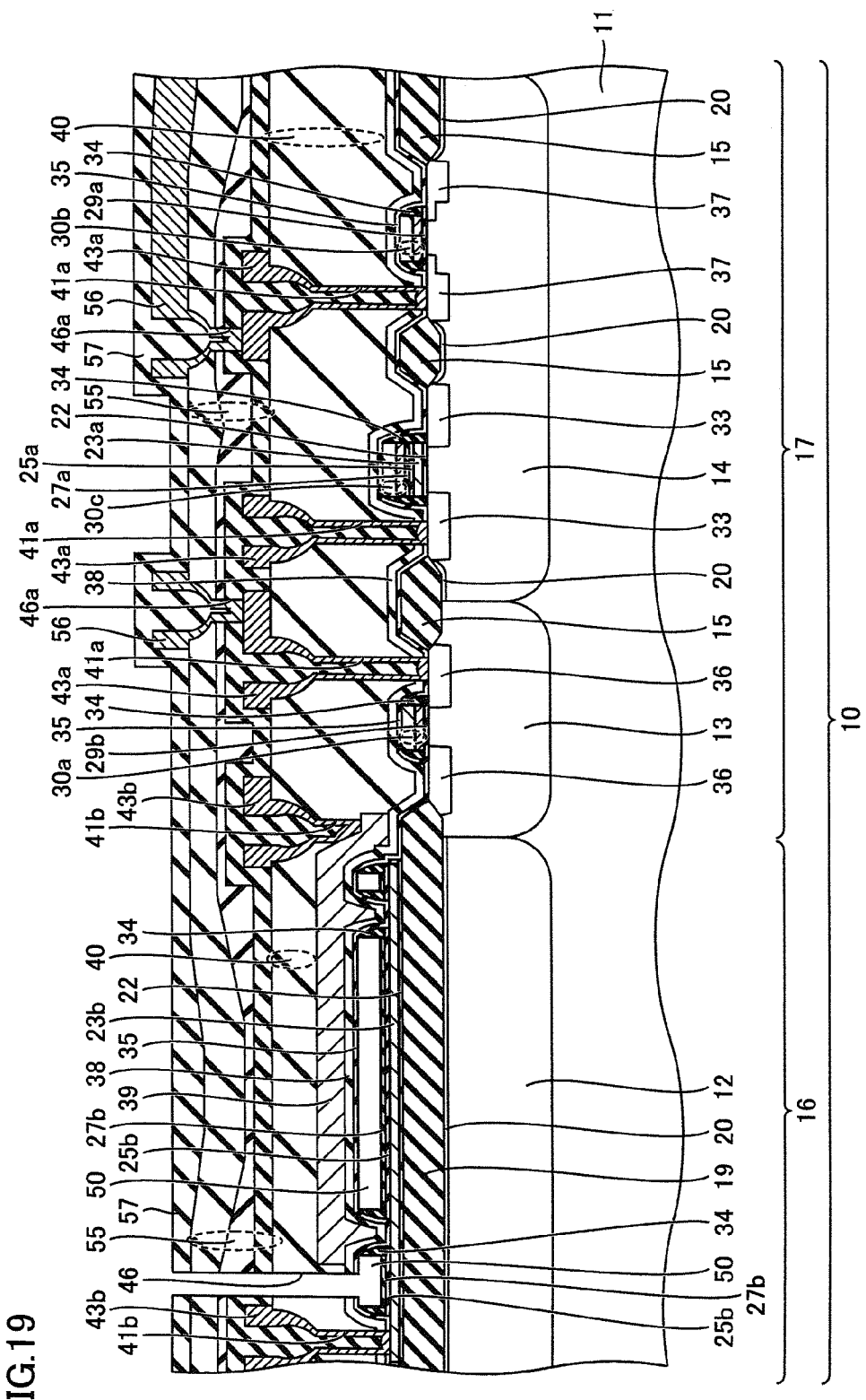

As shown in FIG. 19, second interlayer insulation film 57 is formed so as to cover second interconnection 56. A P-TEOS film or the like, for example, is suitable for second interlayer insulation film 57. For planarization, a stacked structure of P-TEOS/SOG/P-TEOS including a SOG film may be employed. Likewise with the first interlayer insulation film, CMP and/or an etchback process may be applied.

Then, a resist mask (not shown) to form an etching hole is provided by photolithography. Using that resist mask as an etching mask, the insulation film such as second interlayer insulation film 57 is subjected to etching, whereby an etching hole 46 directed to etching the sacrifice film is formed at pressure sensor region 16, as shown in FIG. 19. Then, the resist mask is removed.

By applying etching through etching hole 46, sacrifice film 30d is removed. Thus, a void 50 is formed between movable electrode 39 and fixed electrode 23b. For this etching, wet etching is applied, and TMAH, for example, is employed as the chemical agent.

Then, a process to set void 50 as a vacuum chamber is carried out. First, likewise with the method of forming second interlayer insulation film 57, for example, P-TEOS is applied all over the surface by plasma CVD to form first sealing film 58 that seals etching hole 46. The formation of first sealing film 58 by plasma CVD is carried out under reduced pressure. Accordingly, void 50 constitutes vacuum chamber 51 sealed by first sealing film 58.

Figure 20:
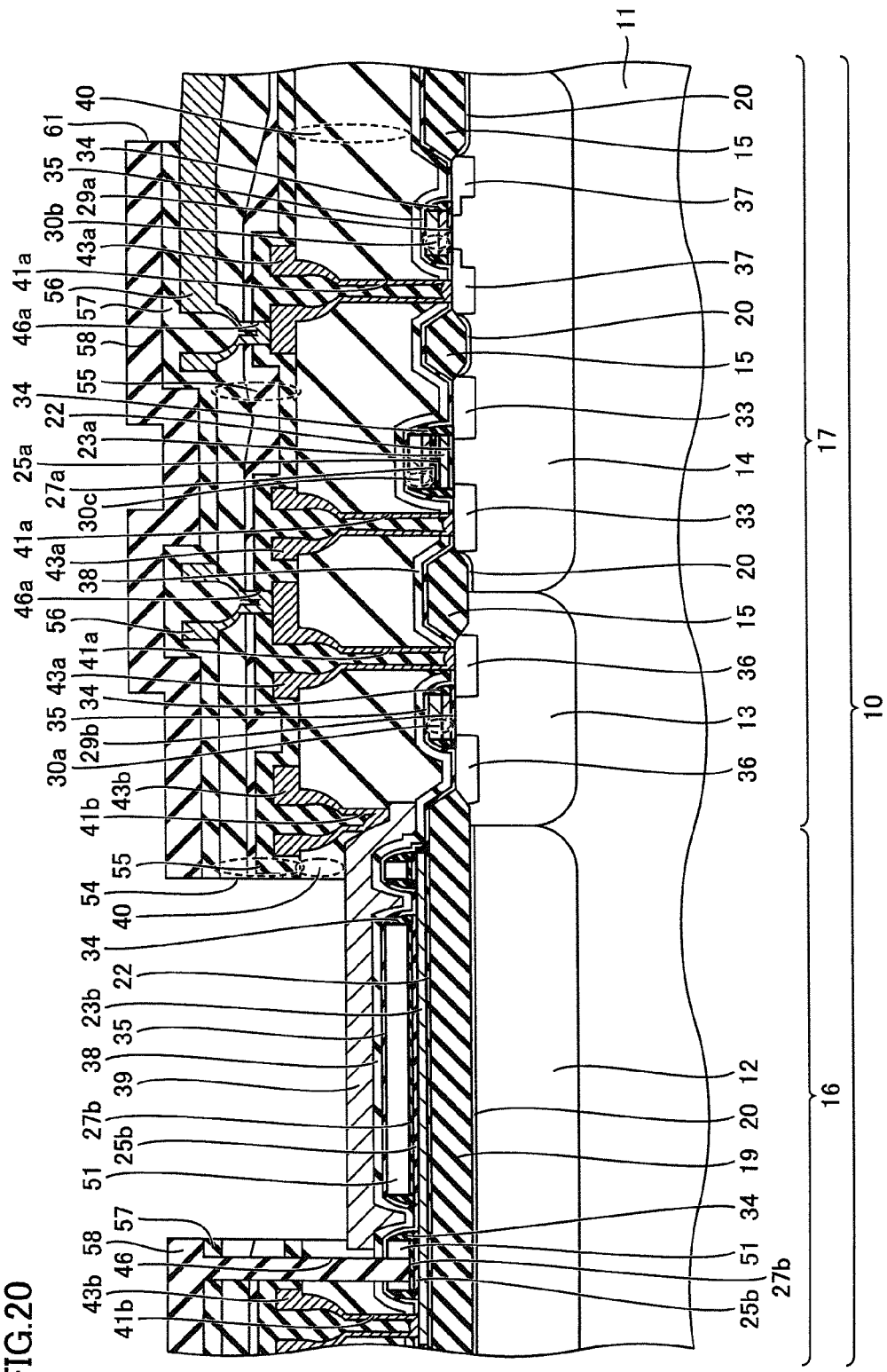
Figure 21:
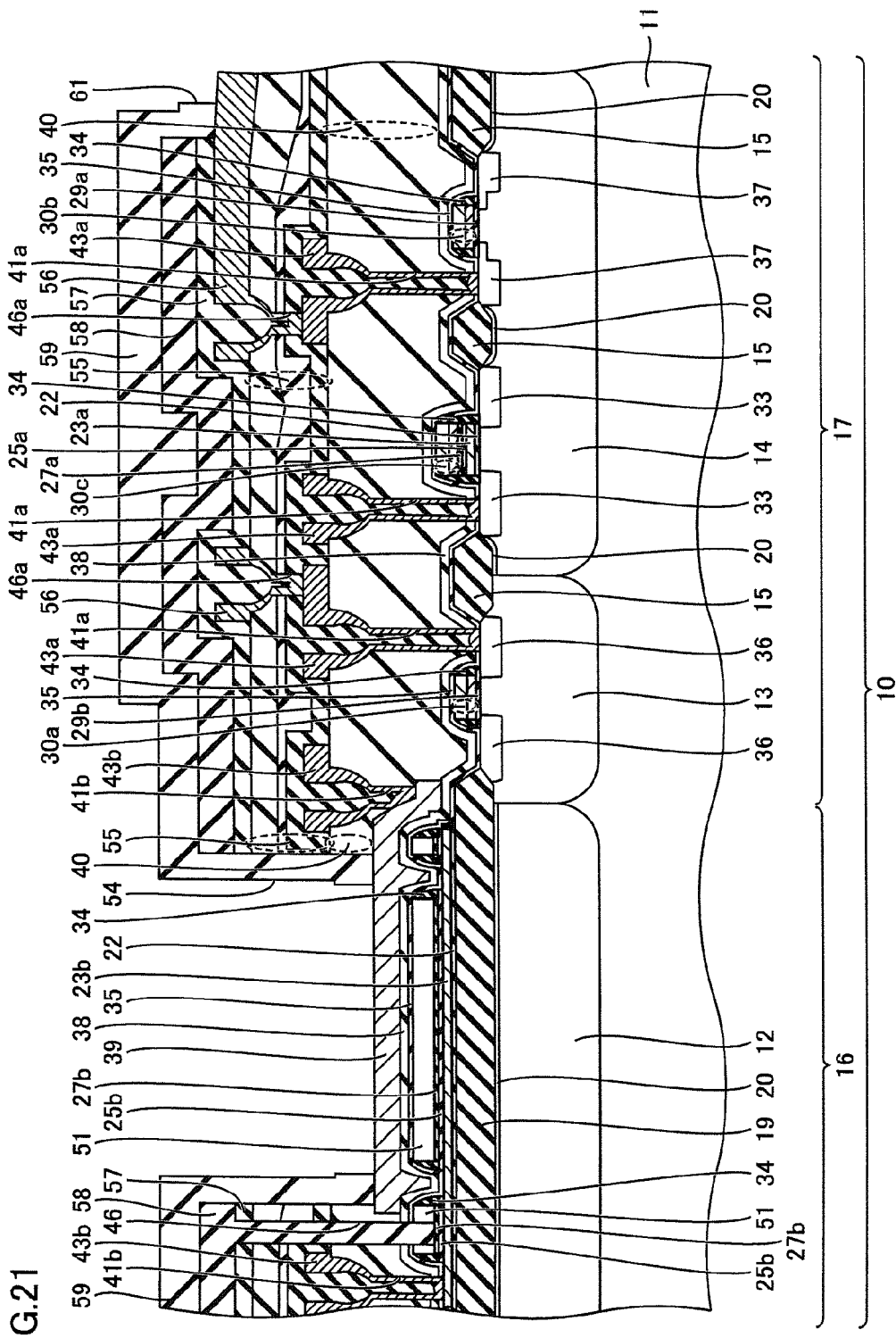

Then, a resist film (not shown) to form a predetermined opening is provided. Using this resist mask as an etching mask, etching is applied, so that an opening 54 for a pressure sensor is formed at pressure sensor region 16 and a pad opening 61 is formed at MOS region 17, as shown in FIG. 20. Then, by plasma CVD as shown in FIG. 21, passivation film 59 is formed so as to cover first sealing film 58 under a condition complying with the specification of the semiconductor device formed at MOS region 17 (relatively low temperature condition and the like).

The semiconductor pressure sensor according to the modification set forth above was based on the case where the metal interconnection of MOS region 17 is a metal interconnection of two layers. A semiconductor pressure sensor may be formed independent of the number of layers of the metal interconnection at MOS region 17. In other words, as a particular step of forming a pressure sensor, the step of forming a surface protection film during the etching process of the sacrifice film, the step of forming an etching hole at the sacrifice film, the step of forming a void by etching the sacrifice film, and the step of sealing the etching hole in vacuum atmosphere are performed, subsequent to formation of metal interconnection at the topmost layer, to form a vacuum chamber. Likewise with the semiconductor pressure sensor having a single layer of metal interconnection set forth above, a standard process directed to forming a MOS circuit can be applied intentionally to provide the advantage of suppressing increase in the number of fabrication steps and contributing to reducing the production cost.

This will be described specifically. A semiconductor pressure sensor according to the modification has fixed electrode 23b of a pressure sensor located at pressure sensor region 16, and an EPROM floating gate electrode 23a located at MOS region 17 formed by a polysilicon film deposited at the same step.

Among the protection film protecting fixed electrode 23b during formation of a void by removing sacrifice film 30d at pressure sensor region 16 through etching, first fixed electrode protection film 25b is formed of the same material at the same time as the step of forming second gate oxide film 25a at MOS region 17. Second fixed electrode protection film 27b is formed of the same material at the same time as the step of forming first silicon nitride film 27a at MOS region 17.

Sacrifice film 30d of pressure sensor region 16 is formed of the same material at the same time as the step of forming a gate electrode 30a of a p channel MOS transistor, a gate electrode 30b of an n channel MOS transistor, and a gate electrode 30c of EPROM at MOS region 17. The relationships of these steps imply that a dedicated step for forming a pressure sensor is not required.

The step of forming movable electrode 39 that is most important in the pressure sensor is set as a dedicated step in forming a semiconductor pressure sensor, and by providing a degree of freedom in the film thickness and processing condition, an optimum design is allowed taking into consideration the characteristic of a pressure sensor while minimizing the affect on the semiconductor device formed at the MOS region.

In the step of forming a sidewall oxide film on the sidewall of the gate electrode at MOS region 17, the sidewall of sacrifice film 30d at pressure sensor region 16 also has a sidewall oxide film 34 formed, so that the shape of the edge at the region supporting metal electrode 31 is rounded. Accordingly, generation of a crack at movable electrode 39 can be suppressed. Further, discontinuation of movable electrode 39 due to insufficient coverage can be prevented. Furthermore, concentration of stress towards the edge of movable electrode 39 when pressure is applied thereto can be alleviated. As a result, a structure of high reliability can be achieved for the semiconductor pressure sensor.

Instead of oxide films 35 and 38 formed at the interface between movable electrode 39 and sacrifice film 30d, the first interlayer insulation film can be divided and stacked. In this case, formation is allowed without changing the first interlayer insulation film at MOS region 17. Thus, more steps of forming a MOS circuit can be applied as the step of forming a pressure sensor to facilitate the process.

In the step of removing the sacrifice film by etching, wet etching is applied. By using TMAH as the chemical agent, a high etching selectivity ratio (approximately 5000-10000)

can be achieved as the etching selectivity between sacrifice film 30d (a layered polycide film of a polysilicon film and tungsten silicide film) and an oxide film (first interlayer insulation film 40 and second interlayer insulation film 45).

By second interlayer insulation film 45 and first interlayer insulation film 40 formed under a condition complying with the specification of the semiconductor device formed at MOS region 17, the semiconductor device formed at MOS region 17 and pressure sensor region 16 can be protected. Therefore, a dedicated step of forming a surface protection film and the step of removing such a surface protection film can be dispensed with since sacrifice film 30d is removed by etching.

From the step of removing sacrifice film 30d by etching to the step of vacuum-sealing void 50, a predetermined process of each step is applied under the state where first interlayer insulation film 40 and second interlayer insulation film 45 are stacked on movable electrode 39. Therefore, movable electrode 39 will be protected by a thick interlayer oxide film, allowing movable electrode 39 from sticking. In other words, the phenomenon of movable electrode 39 being attached to the side of fixed electrode 23b by the influence of surface tension during wet etching can be prevented.

Since a specific step of forming a pressure sensor can be carried out at the latter half of the wafer process following formation of interconnection, and allowing formation of a pressure sensor at this specific step by a process equivalent to the standard process of forming a through hole in a MOS process, the handling during the process is facilitated. More steps of forming a MOS circuit can be applied as the step of forming a pressure sensor, allowing formation of a pressure sensor integrated with a MOS circuit to be facilitated.

The aforementioned specific step of forming a pressure sensor includes, as set forth above, the step of forming a surface protection film for removing the sacrifice film by etching, the step of forming an etching hole at the sacrifice film, the step of removing the sacrifice film by etching to form a void, and the step of sealing the etching hole in a vacuum atmosphere to form a vacuum chamber.

At pressure sensor region 16, second sealing film 52b further sealing the etching hole is formed of the same material at the same time as the step of forming passivation film 52a at MOS region 17. Accordingly, vacuum chamber 51 is double-sealed by first sealing film 49 and second sealing film 52b, allowing vacuum sealing of high reliability.

Intentionally applying a standard process of forming a MOS circuit for a semiconductor pressure sensor according to the aforementioned modification contributes to reducing the production cost by suppressing increase in the fabrication steps, and a semiconductor pressure sensor integrated with a MOS circuit can be fabricated readily. Moreover, degradation in the property for a pressure sensor can be prevented. Particularly, many steps of forming a MOS circuit incorporating an EPROM can be applied as the step of forming a pressure sensor, allowing a pressure sensor integrated with a MOS circuit incorporating an EPROM to be readily fabricated.

In the semiconductor pressure sensor according to the modification, a reference-oriented pressure sensor region 16b (refer to FIG. 16) is formed, likewise with the pressure sensor set forth above. By subtracting a change in the capacitance value of the reference-oriented pressure sensor from the change in the capacitance value of the pressure sensor at detection-oriented pressure sensor region 16a, variation in the initial values of capacitance values can be canceled, allowing a pressure value of high accuracy to be measured.

Second Embodiment

The previous semiconductor pressure sensor was described corresponding to the case where the step of forming a surface protection film, the step of forming an etching hole, and the step of forming a vacuum chamber that are specific steps of forming a pressure sensor were performed, subsequent to formation of a metal interconnection at MOS region 17.

The second embodiment is directed to a semiconductor pressure sensor having two or more layers of multilayer metal interconnection formed as the metal interconnection at MOS region 17. The semiconductor pressure sensor has a through hole to electrically connect the topmost layer of metal interconnection with a metal interconnection located lower than the metal interconnection of the topmost layer, and an etching hole directed to removing sacrifice layer formed at the same time, and the topmost layer of metal interconnection the and vacuum chamber formed at the same time. Each component in the fabrication step has the same reference character allotted in a structure similar to that of the first example, and description thereof will not be repeated unless necessary.

Figure 22:
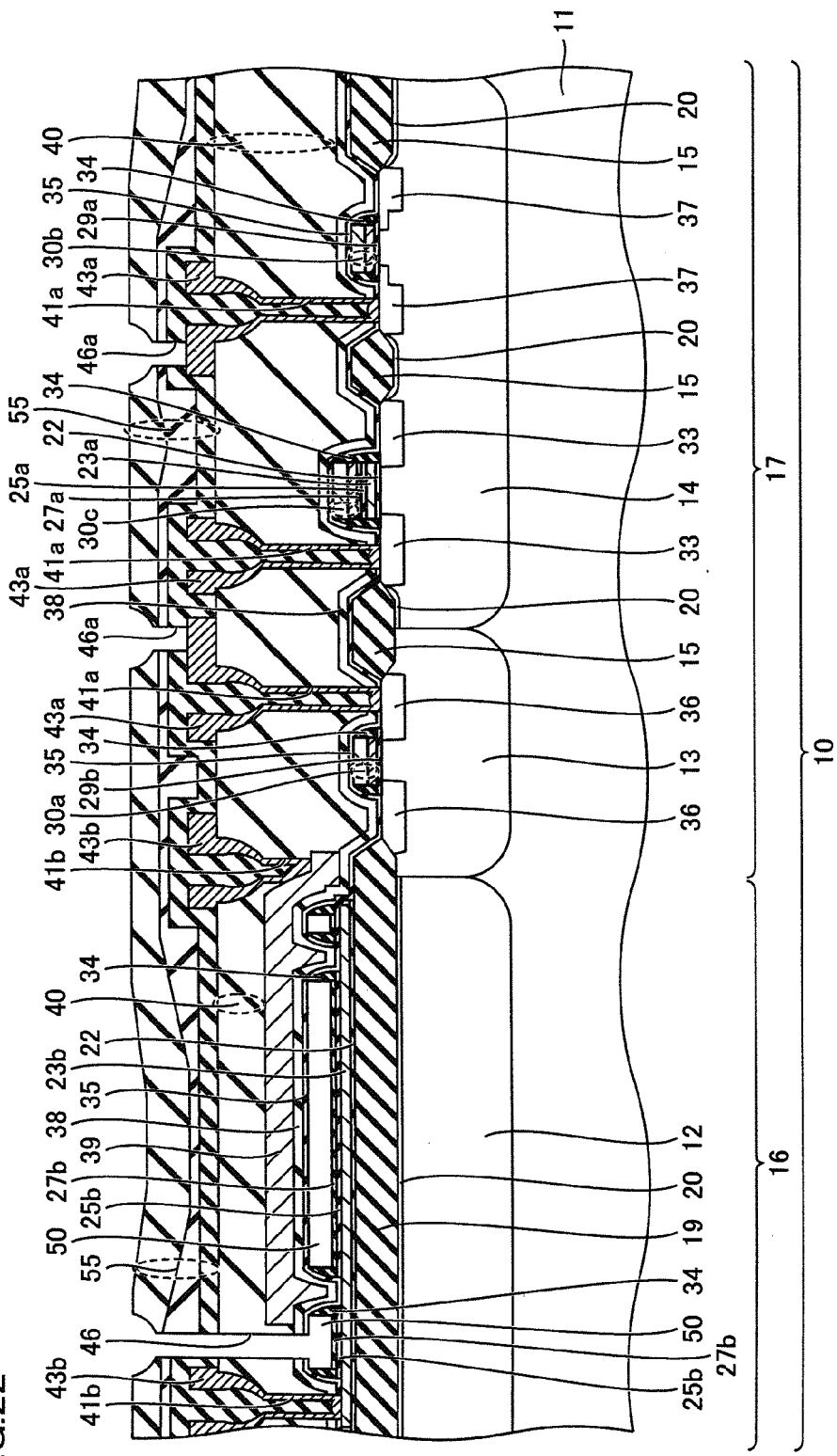
FIG. 22 is a sectional view representing a step in a fabrication method of a semiconductor pressure sensor according to a second embodiment of the present invention.

Subsequent to steps similar to those shown in FIGS. 1-16, first interconnection 43a is formed at MOS region 17, as shown in FIG. 22, and interconnection 43b is formed as the metal interconnection of the first layer at pressure sensor region 16. Then, an interlayer oxide film 55 is formed so as to cover first interconnection 43a and interconnection 43b. As interlayer oxide film 55, a P-TEOS film, for example, or the like is suitable. For planarization, a stacked structure of P-TEOS/SOG/P-TEOS including a SOG film may be employed. Moreover, likewise with the first interlayer insulation film, CMP and/or an etchback process may be applied as the planarization process.

A resist mask (not shown) for forming an etching hole and through hole simultaneously is performed by photolithography. Using the resist mask as an etching mask, etching is applied under a condition complying with the specification of the semiconductor device formed at MOS region 17. Accordingly, at MOS region 17, a through hole 46a reaching first interconnection 43a through interlayer oxide film 55 is formed at MOS region 17, whereas etching hole 46 is formed at pressure sensor region 16. Then, the resist mask is removed.

With regard to the etching process at this stage, through hole 46a and etching hole 46 may be formed by an etching process based on a combination of wet etching and dry etching. In this case, through hole 46a and etching hole 46 are a through hole and etching hole having a widening at the upper portion of the opening, as shown in FIG. 22. Also, through hole 46a and etching hole 46 may be formed by an etching process of dry etching alone.

By applying etching through etching hole 46, sacrifice film 30d (refer to FIG. 16) based on a stacked structure of a polysilicon film and tungsten silicide ($WSi_2$) film is removed. Accordingly, a void 50 is formed between movable electrode 39 and fixed electrode 23b. FIG. 22 corresponds to the step at this stage. In the etching process, wet etching is applied, and TMAH, for example, is employed as the chemical agent. In the process of removing sacrifice film 30d, a dry etching process applying xenon difluoride ($XeF_2$) or the like may be applied, in addition to wet etching.

Figure 23:
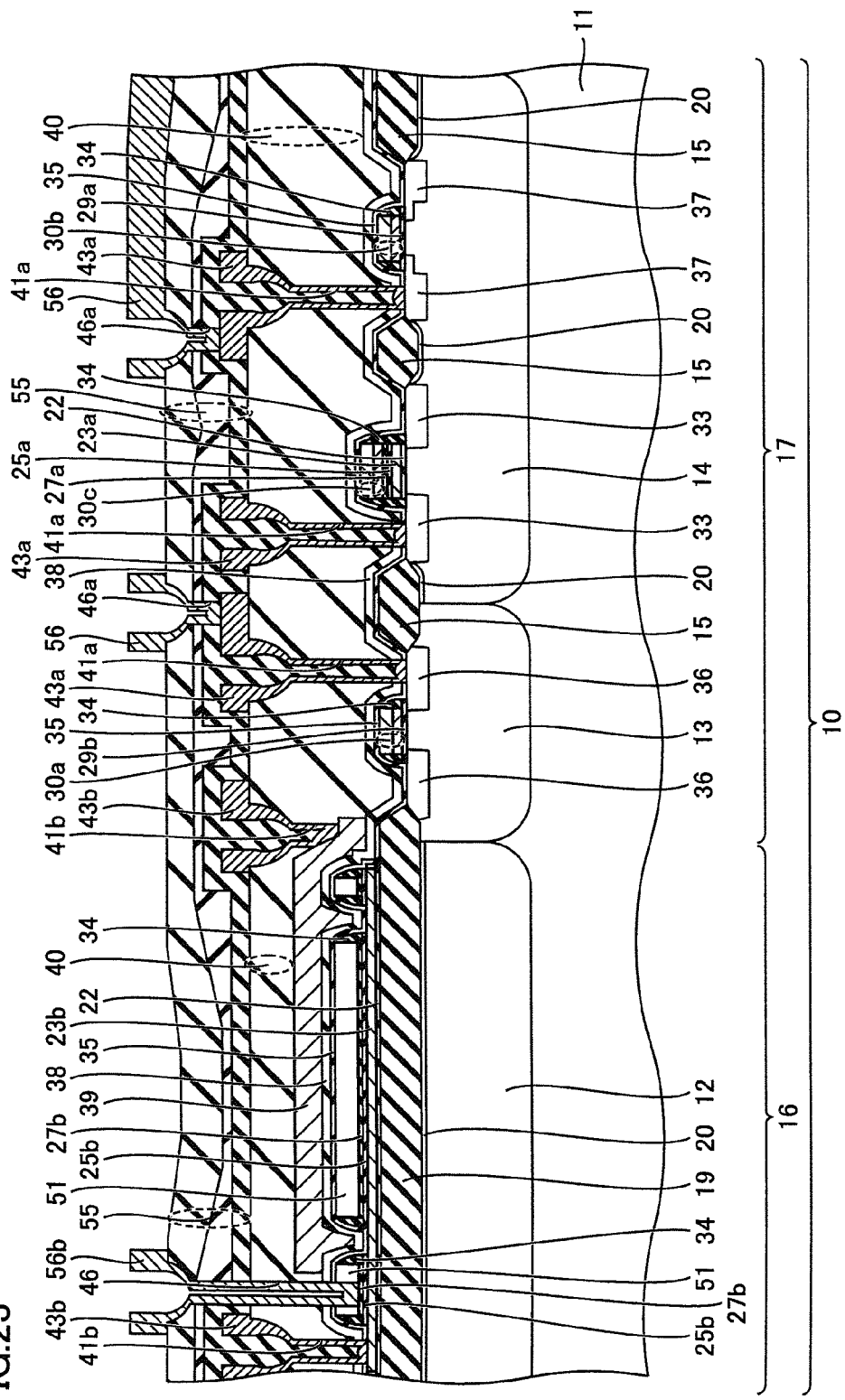
FIGS. 23 and 24 are sectional views representing a step performed after the step of a preceding drawing in the second embodiment.

Then, as shown FIG. 23, second interconnection 56 is formed at MOS region 17 whereas first metal sealing film 56b is formed at the pressure sensor region 16. A barrier metal film and an aluminium silicon copper (AlSiCu) film (both not shown) are formed so as to cover interlayer oxide film 55. As a barrier metal film, a titanium nitride (TiN) film, for example, is applied. Then, by patterning the aluminium silicon copper film, second interconnection 56 is formed at MOS region 17, whereas first metal sealing film 56b is formed at pressure sensor region 16.

Specifically, a resist mask is formed on the aluminium silicon copper film, and using that resist mask as an etching mask, the aluminium silicon copper film and barrier metal layer are subjected to etching. Then, the resist mask is removed to form second interconnection 56 and first metal sealing film 56b. Second interconnection 56 is electrically connected to first interconnection 43a.

First metal sealing film 56b is formed by sputtering an aluminium silicon copper film. Since sputtering is performed in vacuum, the sealing of etching hole 46 with first metal sealing film 56b causes void 50 to attain a vacuum chamber 51. During formation of second interconnection 56 and first metal sealing film 56b, a tungsten plug is formed at through hole 46a and etching hole 46, and then a barrier metal and aluminium copper (AlCu) film may be formed, followed by patterning. A barrier metal suitable for such a configuration includes titanium silicide ($TiSi_2$), cobalt silicide ($CoSi_2$) film, or the like.

Figure 24:
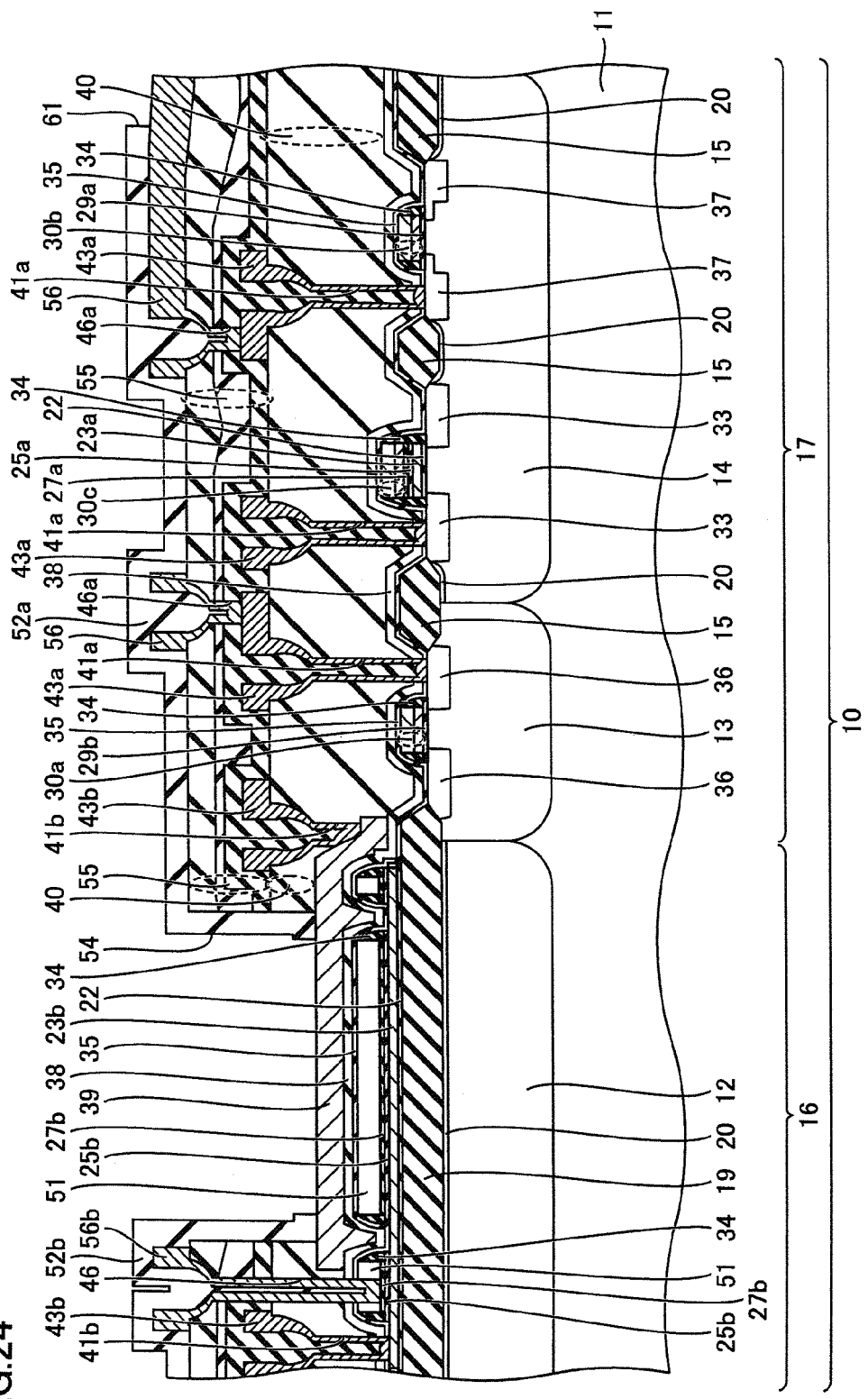

Then, a resist film (not shown) for forming an oxide film at pressure sensor region 16 is provided. Using the resist mask as an etching mask, etching based on dry etching or a combination of dry etching and wet etching is applied to remove the portion of interlayer oxide film 55 and first interlayer insulation film 40 located at pressure sensor region 16. Accordingly, opening 54 is formed at pressure sensor region 16, as shown in FIG. 24.

Then, by plasma CVD, a silicon nitride film (not shown) qualified as a passivation film and having a film thickness of approximately 0.5-1.0 μm (not shown) is formed so as to cover first metal sealing film 56b and second interconnection 56 under a condition complying with the specification of the semiconductor device formed at MOS region 17 (a relatively low temperature condition and the like).

Then, a resist mask (not shown) is formed that exposes the portion of opening 54 of the pressure sensor at pressure sensor region 16 and that exposes the portion corresponding to the pad opening at MOS region 17. Then, by applying dry etching using the resist mask as an etching mask, passivation film 56a having pad opening 61 is formed at MOS region 17. At pressure sensor region 16, second sealing film 52b additionally sealing etching hole 46 is formed. Accordingly, vacuum chamber 51 is double-sealed by first metal sealing film 56b and second sealing film 52b, allowing vacuum sealing of high reliability. FIG. 24 corresponds to the step of this stage.

In the fabrication method of a semiconductor pressure sensor set forth above, through hole 46a at MOS region 17 and etching hole 46 at pressure sensor region 16 are formed at the same time. Also, the interconnection of the topmost layer at MOS region 17 and the first metal sealing film at pressure sensor region 16 are formed at the same time. Accordingly, in addition to the advantage of the first embodiment, there is an advantage that a semiconductor pressure sensor can be formed at the same time by a process common to the process of forming a MOS circuit. The addition of a dedicated step to form a semiconductor pressure sensor can be suppressed to reduce the fabrication cost. More steps of forming a MOS circuit can be applied by the process standardization, allowing formation of a pressure sensor integrated with a MOS circuit to be facilitated.

Third Embodiment

The previous semiconductor pressure sensor was described based on the case where the pressure sensor is formed on a field oxide film. The third embodiment is directed to a semiconductor pressure sensor having a pressure sensor formed at a region of a semiconductor conductor substrate (element formation region) defined by a field oxide film.

Elements in the fabrication steps similar to those in the first embodiment have the same reference characters allotted, and description thereof will not be repeated unless necessary. Furthermore, since the MOS region has a structure substantially identical to that of the MOS region described in the first embodiment, only the pressure sensor region is shown in the drawing.

Figure 25:
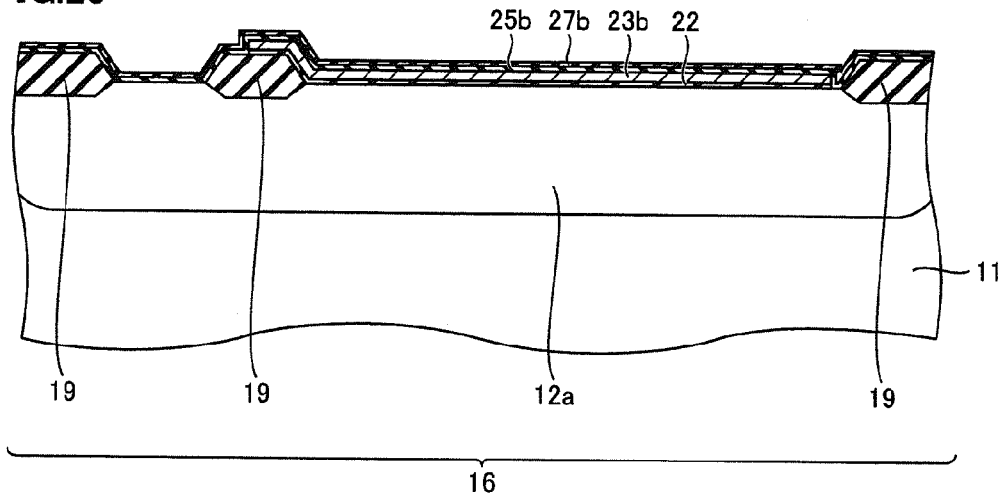
FIG. 25 is a partial sectional view representing a step in a fabrication method of a semiconductor pressure sensor according to a third embodiment of the present invention.

As shown in FIG. 25, an n type first well region 12a is formed at pressure sensor region 16 where a pressure sensor is to be formed. Then, a field oxide film 19 is formed by LOCOS, for example. Field oxide film 19 has a film thickness of approximately 0.2 to 1.0 p.m. By applying thermal oxidation to silicon substrate 11, first gate oxide film 22 is formed.

Then, an n type conductive polysilicon film (not shown) is formed so as to cover first gate oxide film 22. The film thickness of the conductive polysilicon film is set to approximately 50-300 nm. Then, by applying predetermined photolithography and etching to the conductive polysilicon film, a fixed electrode 23b is formed at pressure sensor region 16. At the same time, a floating gate electrode 23a of an EPROM is formed at MOS region 17 (refer to the MOS region in FIG. 3).

Then, by applying thermal oxidation, a first fixed electrode protection film 25b is formed so as to cover fixed electrode 23b at pressure sensor region 16. At the same time, a second gate oxide film 25a is formed so as to cover the polysilicon film pattern at MOS region 17 (refer to the MOS region in FIG. 3).

Then, by forming a silicon nitride film through CVD, a second fixed electrode protection film 27b is formed at pressure sensor region 16. At the same time, a first silicon nitride film 27a is formed so as to cover second gate oxide film 25a at MOS region 17 (refer to the MOS region in FIG. 3). First fixed electrode protection film 25b and second fixed electrode protection film 27b are the protection film of the fixed electrode when the sacrifice film is removing by etching that will be described afterwards.

Figure 26:
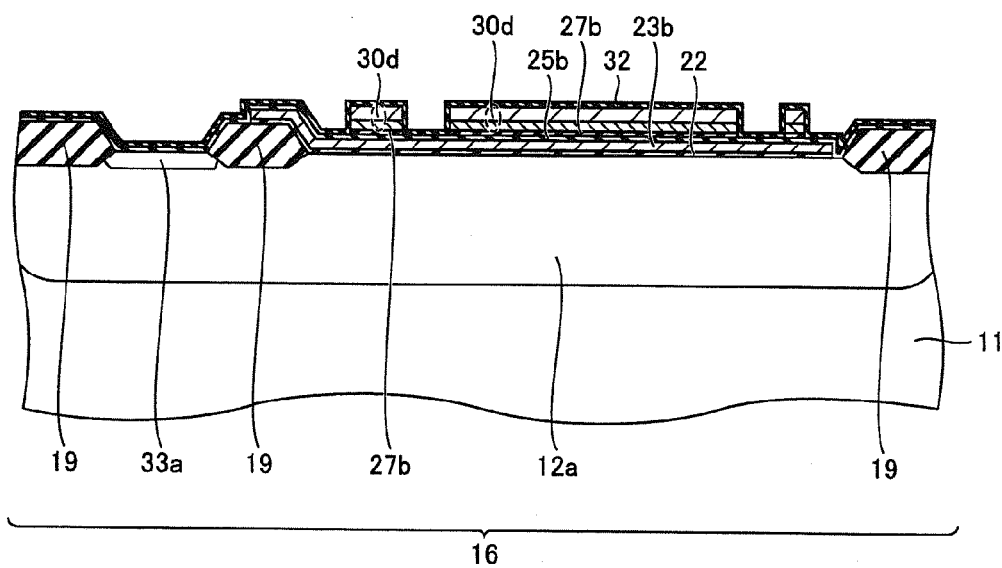
FIGS. 26-32 are partial sectional views representing a step performed after the step of a preceding drawing in the third embodiment.

Then, a stacked film of a polysilicon film (approximately 50-300 nm in film thickness) and a tungsten silicide ($WSi_2$) film (approximately 50-300 nm in film thickness), i.e, a polycide film (not shown), is formed. Then, by applying predetermined photolithography and etching to the polycide film, an n type impurity region 33a of high impurity concentration is formed, in addition to sacrifice film 30d directed to forming a void (vacuum chamber), at pressure sensor region 16, as shown in FIG. 26. At MOS region 17, a gate electrode 30a of a p channel type MOS transistor and a gate electrode 30b of an n channel MOS transistor are formed (refer to the MOS region in FIG. 6).

Gate electrode 30c of the EPROM at MOS region 17 is patterned, prior to formation of gate electrodes 30a and 30b, and subsequent to this step, impurities directed to forming first source/drain region 33 are implanted (refer to the MOS region in FIG. 5). At this stage, patterning and impurity implantation directed to forming n type impurity region 33a of high impurity concentration are carried out at the same time at pressure sensor region 16.

Then by performing thermal treatment under a predetermined condition, a thin oxide film 32 is formed so as to cover sacrifice film 30d and the like, and first source/drain region 33 (refer to the MOS region in FIG. 6) and n type impurity region 33a are activated.

Figure 27:
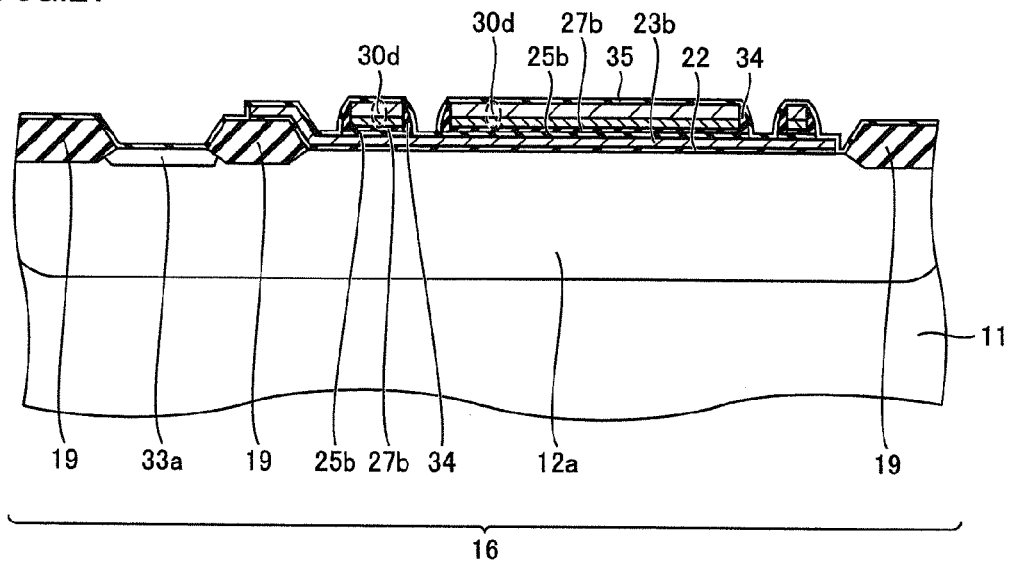

Then, a TEOS film (not shown), for example, is formed so as to cover sacrifice film 30d and the like. Then, anisotropic dry etching is applied all over the surface of the TEOS film to form a sidewall oxide film 34 at the sidewall face of sacrifice film 30d at pressure sensor region 16, as shown in FIG. 27. At MOS region 17, sidewall oxide film 34 is formed at the sidewall of gate electrodes 30a, 30b and 30c (refer to the MOS region in FIG. 7). Then, a second source/drain region 37 and a third source/drain region 36 are formed at MOS region 17 (refer to the MOS region in FIG. 7).

Figure 28:
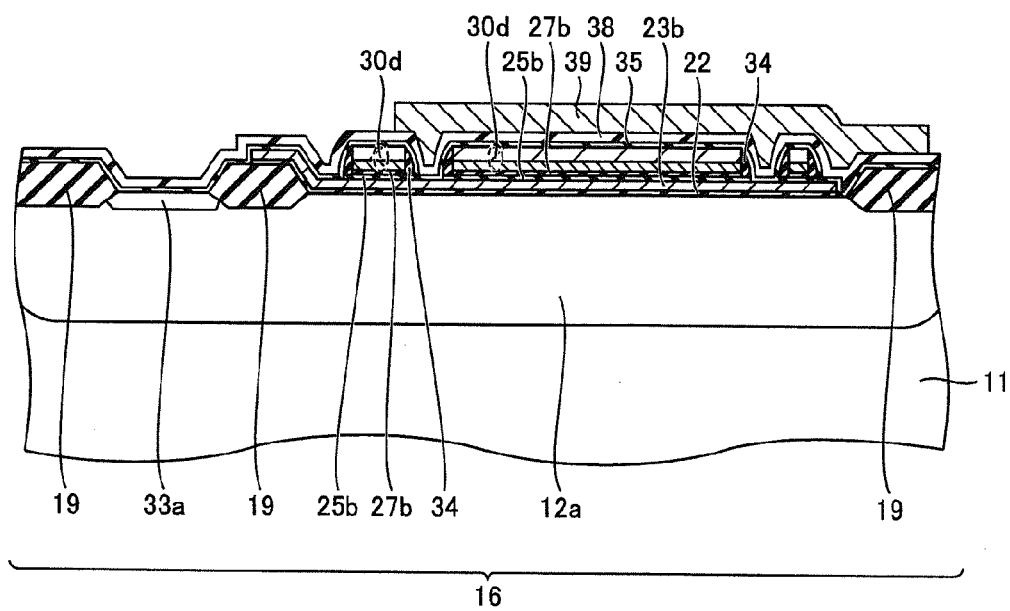

By applying annealing under a predetermined condition, a thin oxide film 35 is formed so as to cover sacrifice film 30d at pressure sensor region 16. At MOS region 17, thin oxide film 35 is formed so as to cover gate electrodes 30a, 30b and 30c (refer to the MOS region in FIG. 7). Then, a TEOS type oxide film 38 is formed so as to cover oxide film 35, as shown in FIG. 28.

Then, a conductive polysilicon film (not shown) is formed so as to cover oxide film 38. By applying predetermined photolithography and etching, a movable electrode 39 covering a portion of sacrifice film 30d is formed, as shown in FIG. 28. This movable electrode 39 is the most important diaphragm in the semiconductor pressure sensor. The property of the semiconductor pressure sensor is substantially determined by the processing condition of movable electrode 39. Movable electrode 39 has a film thickness of approximately 50-1000 nm.

Figure 29:
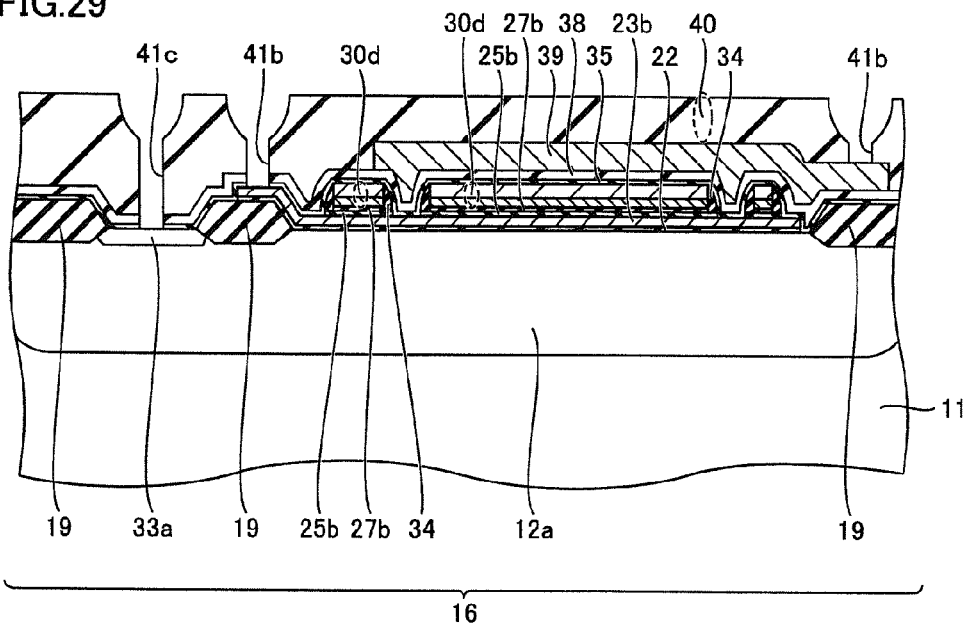

Then, first interlayer insulation film 40 is formed so as to cover oxide film 38 and movable electrode 39. Then, under a condition complying with the specification of the semiconductor device formed at the MOS region (not shown), predetermined photolithography and etching are applied to first interlayer insulation film 40 and the like. Accordingly, contact hole 41b exposing fixed electrode 23b, contact hole 41b exposing movable electrode 39, and contact hole 41c exposing first well region 12a are formed at pressure sensor region 16, as shown in FIG. 29. At MOS region 17, contact hole 41a passing through first interlayer insulation film 40, and exposing first source/drain region 33, second source/drain region 37 and third source/drain region 36 and the like is formed (refer to the MOS region in FIG. 9).

Figure 30:
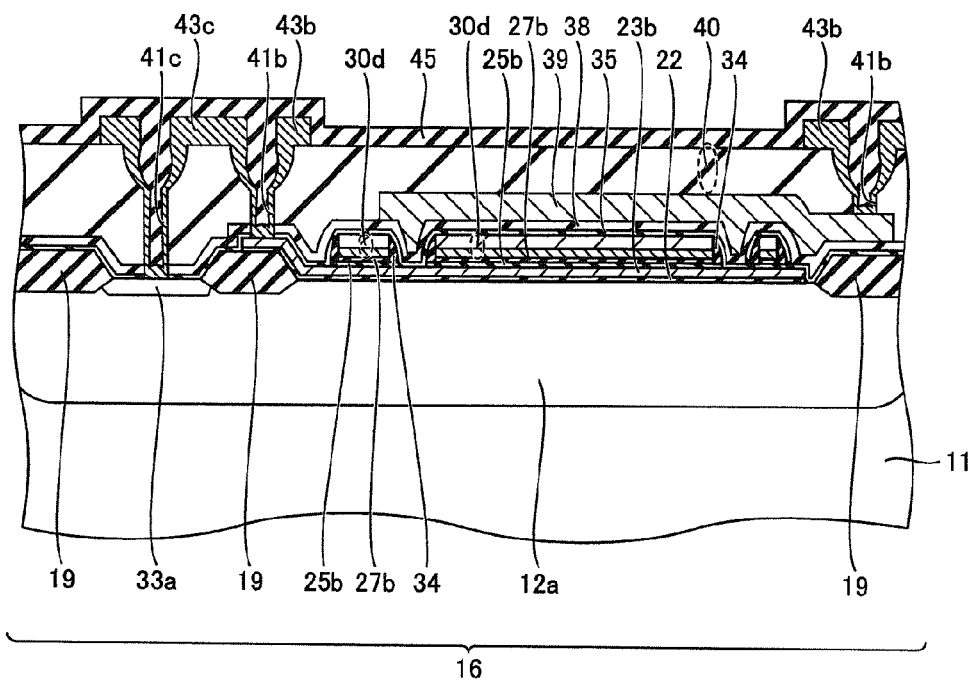

Then, a barrier metal film and an aluminium silicon copper film (both not shown) is formed so as to cover first interlayer insulation film 40, based on a condition complying with the specification of the semiconductor device formed at the MOS region (not shown). Then, by patterning that aluminium silicon copper film and the like, interconnection 43b and interconnection 43c are formed at pressure sensor region 16, as shown in FIG. 30. At MOS region 17, first interconnection 43a is formed (refer to the MOS region in FIG. 10).

Figure 31:
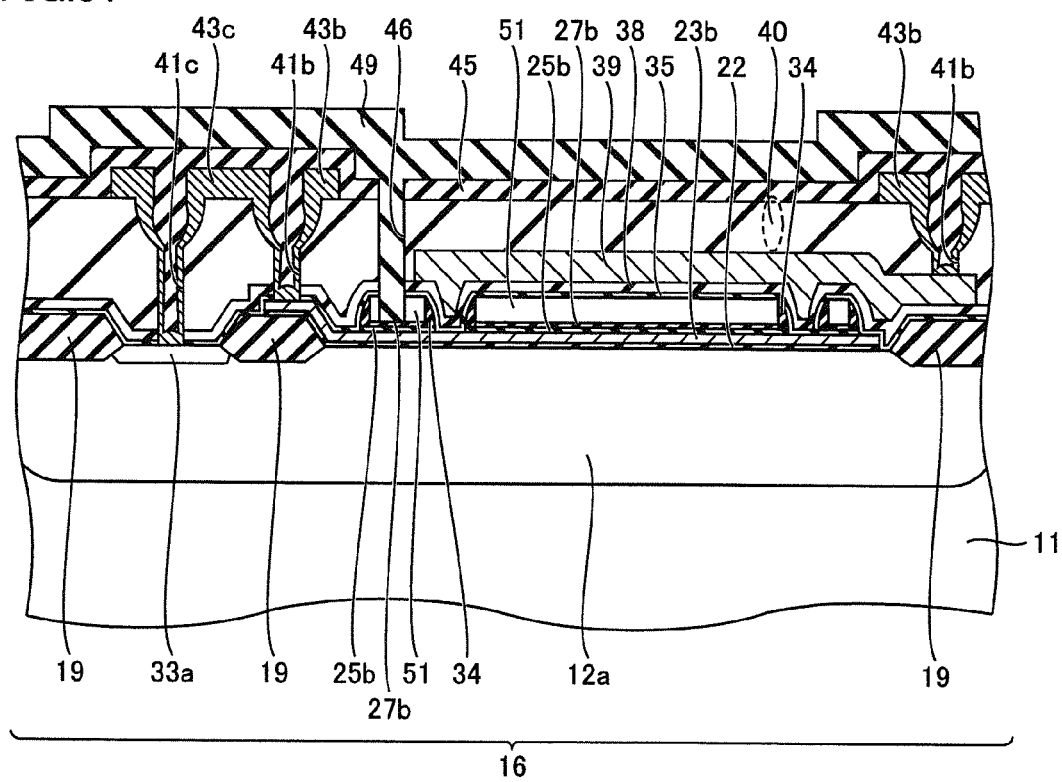
Figure 32:
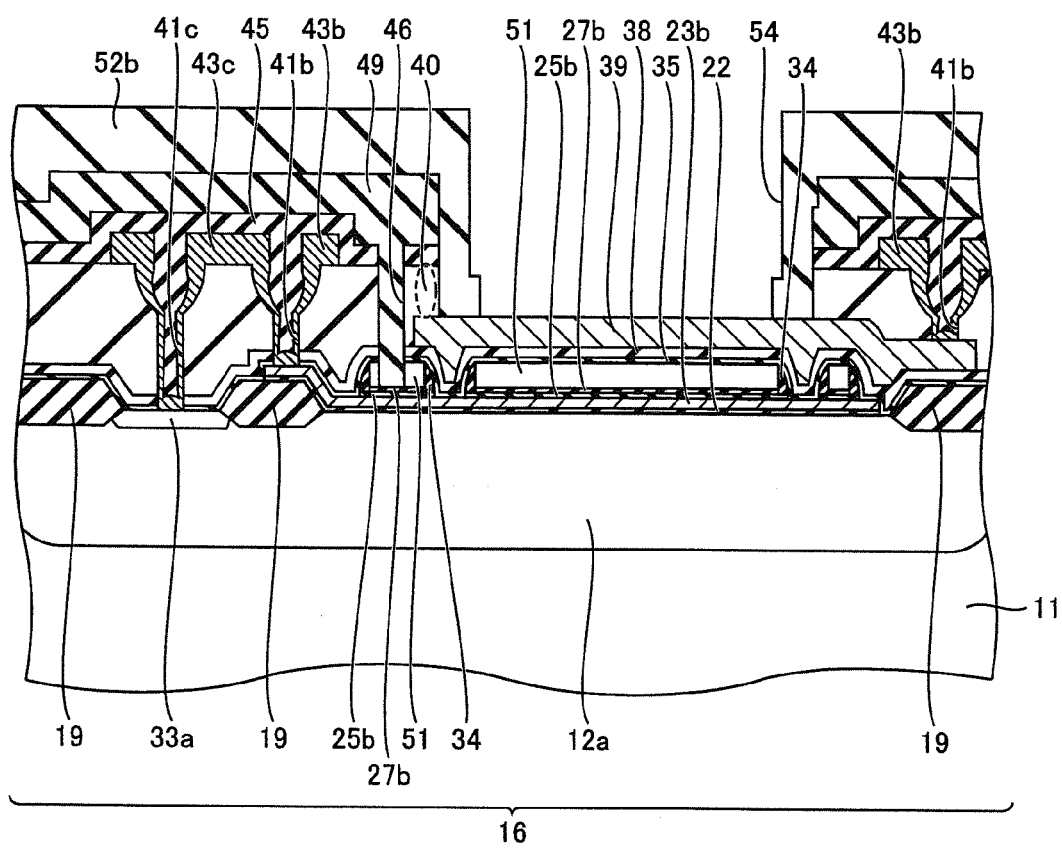

Then, subsequent to steps similar to those shown in FIGS. 10-12, void 50 formed by removing sacrifice film 30d is sealed by first sealing film 49 to form vacuum chamber 51 at pressure sensor region 16, as shown in FIG. 31. Then, subsequent to steps similar to those shown in FIGS. 13 and 14, opening 54 of the pressure sensor exposing movable electrode 39 is formed and a second sealing film 52b additionally sealing etching hole 46 is formed at pressure sensor region 16, as shown in FIG. 32. At MOS region 17, pad opening 61 is provided, and passivation film 52a is formed (refer to the MOS region in FIG. 14). Thus, the main components of the semiconductor pressure sensor are formed.

The aforementioned semiconductor pressure sensor provides the following advantage, in addition to the advantage described in the first embodiment. By forming a pressure sensor having fixed electrode 23b, vacuum chamber 51 (sacrifice film 30d), and movable electrode 39 stacked at the region of silicon substrate 11 surrounded by field oxide film 19, the stepped portion corresponding to the film thickness of field oxide film 19 can be alleviated at pressure sensor region 16, facilitating the wafer process. Furthermore, by eliminating the stepped portion corresponding to the film thickness of field oxide film 19, the film thickness of the movable electrode at the pressure sensor can be set thicker.

Although FIG. 32 represents a configuration in which a portion of fixed electrode 23 and a portion of movable electrode 39 are arranged on field oxide film 19, a configuration in which the entirety of fixed electrode 23b and movable electrode 39 is arranged on the semiconductor substrate (first gate oxide film 22) surrounded by the field oxide film may be employed. Accordingly, the advantage of alleviating the stepped portion can be further increased.

By electrically connecting fixed electrode 23b and first well region 12a through interconnection 43b and interconnection 43c to be set at equal potential, the effect of the capacitance component of fixed electrode 23b with first gate oxide film 22, first well region 12a and silicon substrate 11 can be eliminated.

The plane pattern shown in FIG. 32 is only a way of example. The pattern is not restricted thereto. Further, a similar advantage can be achieved even in the case where the above-described configuration is applied to the pressure sensor region of the semiconductor pressure sensor described in the second embodiment.

Fourth Embodiment

The semiconductor pressure sensor of the third embodiment is based on the case where a pressure sensor having a fixed electrode, a vacuum chamber (sacrifice film) and a movable electrode stacked at a region of the semiconductor substrate (first gate oxide film 22) surrounded by a field oxide film was described. The fourth embodiment is directed to a semiconductor pressure sensor employing a well region as the fixed electrode of such a pressure sensor.

Figure 33:
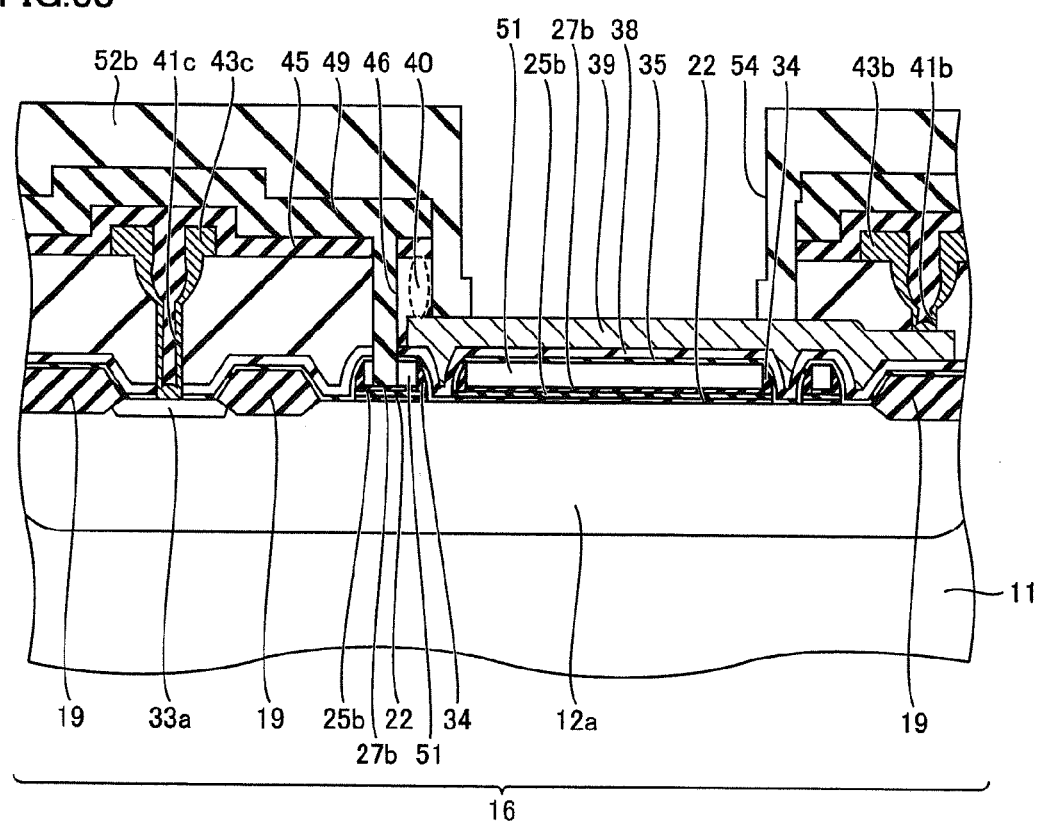
FIG. 33 is a partial sectional view of a semiconductor pressure sensor according to a fourth embodiment of the present invention.

As shown in FIG. 33, n type first well region 12a is formed as the fixed electrode of the pressure sensor at pressure sensor region 16 of the semiconductor pressure sensor. Above first well region 12a, vacuum chamber 51 is located, and movable electrode 39 is arranged on vacuum chamber 51. An n type impurity region 33a of high impurity concentration is formed between first interconnection 43c and first well region 12a.

Since the remaining structure is similar to that of the semiconductor pressure sensor described in the first embodiment and third embodiment, the same elements have the same reference characters allotted, and description thereof will not be repeated unless necessary. Although the configuration of the MOS region is not shown in FIG. 33 for the convenience of simplicity in the drawings, the configuration thereof is similar to that of the MOS transistor in the semiconductor pressure sensor described in the first embodiment (refer to the MOS region in FIG. 14 and the like).

The aforementioned semiconductor pressure sensor is produced by a method of fabricating a semiconductor pressure sensor described in the third embodiment, provided that the step of forming fixed electrode 23b by a polysilicon film is not necessary. In other words, sacrifice film 30d and the like are formed at the step shown in FIG. 26, without forming fixed electrode 23b in the step of FIG. 25. Then, followed by steps similar to those shown in FIGS. 27-32 are carried out to provide the semiconductor pressure sensor shown in FIG. 33.

The above-described semiconductor pressure sensor provides the following advantages, in addition to the advantage described in the first embodiment. As the pressure sensor, first well region 12a constitutes the fixed electrode, with vacuum chamber 51 and movable electrode 39 stacked at the region of silicon substrate 11 surrounded by field oxide film 19.

Accordingly, the stepped portion corresponding the film thickness of the polysilicon film (fixed electrode 23b), in addition to the film thickness of field oxide film 19, can be alleviated, as compared to the semiconductor pressure sensor described in the third embodiment. The wafer process can be further facilitated. Moreover, by eliminating the stepped portion corresponding to the film thickness of field oxide film 19 and the stepped portion corresponding to the film thickness of the polysilicon film, movable electrode 39 of the pressure sensor can be set further thicker.

Although FIG. 33 corresponds to a configuration in which a portion of movable electrode 39 is located on field oxide film 19, a configuration in which the entirety of movable electrode 39 is arranged on the semiconductor substrate (first gate oxide film 22) surrounded by the field oxide film can be employed. Accordingly, the advantage of alleviating the stepped portion can be further increased. A similar advantage can be achieved by applying the above-described configuration to the pressure sensor region of a semiconductor pressure sensor described in the second embodiment.

The present invention is effectively applicable to a semiconductor pressure sensor with a MOS circuit including a memory cell transistor or a transistor.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor pressure sensor comprising:
    a first region and a second region defined at a surface of a semiconductor substrate,
    a pressure sensor formed at said first region, and including a fixed electrode, a void, and a movable electrode, said void located above said fixed electrode, and said movable electrode located above said void,
    a memory cell transistor formed at said second region, and including a first electrode and a second electrode formed of two different layers and arranged above said first electrode as a gate electrode,
    an interlayer insulation film formed so as to cover said pressure sensor and said memory cell transistor,
    a hole formed at said interlayer insulation film, communicating with said void,
    a sealing portion sealing said void,
    an opening formed at said interlayer insulation film, and exposing said movable electrode,
    said fixed electrode formed of a film identical to a conductor film qualified as said first electrode,
    said void formed by removing a portion from a film identical to another conductor film qualified as said second electrode such that the height of the void as measured in a direction perpendicular to said surface of the semiconductor substrate is essentially the same as the thickness of said second electrode and
    said hole does not overlap said movable electrode in plan view and is not in direct contact with said movable electrode.

2. The semiconductor pressure sensor according to claim 1, further comprising:
    a first protection film covering a top face of said fixed electrode,
    a second protection film covering a bottom face of said movable electrode,
    a first insulation film located between said first electrode and said second electrode, and
    a second insulation film formed between said second electrode and said interlayer insulation film, so as to cover said second electrode, wherein
    said first protection film is formed of a portion of a film identical to a film qualified as said first insulation film,
    said second protection film is formed of a portion of a film identical to a film qualified as said second insulation film.

3. The semiconductor pressure sensor according to claim 1, further comprising:
    a third insulation film formed so as to cover said interlayer insulation film, and
    a passivation film formed so as to cover said third insulation film,
    wherein said sealing portion includes
    a first sealing portion formed of a portion of a film identical to a film qualified as said third insulation film, and
    a second sealing portion formed of a portion of a film identical to a film qualified as said passivation film.

4. The semiconductor pressure sensor according to claim 1, wherein said sealing portion includes a portion formed by a film of a type identical to the type of said interlayer insulation film.

5. The semiconductor pressure sensor according to claim 1, wherein said pressure sensor comprises
    a first pressure sensor including a first fixed electrode as said fixed electrode, a first void as said void, and a first movable electrode as said movable electrode, and
    a second pressure sensor including a second fixed electrode as said fixed electrode, a second void as said void, and a second movable electrode as said movable electrode,
    said opening formed at a region of said interlayer insulation film located above said first pressure sensor,
    said second pressure sensor set at a state covered with said interlayer insulation film.

6. The semiconductor pressure sensor according to claim 1, wherein a sidewall is located at a side of said void.

7. The semiconductor pressure sensor according to claim 1, further comprising an element isolation insulation film formed at said first region,
    wherein said pressure sensor is formed on said element isolation insulation film.

8. The semiconductor pressure sensor according to claim 1, further comprising an element isolation insulation film formed at said first region,
    wherein said pressure sensor is formed at a region of said semiconductor substrate defined by said element isolation insulation film.

9. The semiconductor pressure sensor according to claim 1, wherein said sealing portion includes a portion formed from any of aluminium (Al), aluminium silicon (Al—Si), aluminium silicon copper (Al—Si—Cu), and aluminium copper (Al—Cu).

10. A semiconductor pressure sensor comprising:
    a first region and a second region defined at a surface of a semiconductor substrate,
    a pressure sensor formed at said first region, and including a fixed electrode, a void, and a movable electrode, said void located above said fixed electrode, and said movable electrode located above said void,
    a transistor formed at said second region, and including a gate electrode,
    an interlayer insulation film formed so as to cover said pressure sensor and said transistor, a hole formed at said interlayer insulation film, communicating with said void, a sealing portion sealing said void, and an opening formed at said interlayer insulation film, and exposing said movable electrode, said fixed electrode being a well region formed from a surface of said semiconductor substrate to a predetermined depth, said void formed by removing a portion of a film identical to a conductor film formed of two different layers and qualified as said gate electrode such that the height of the void as measured in a direction perpendicular to said surface of the semiconductor substrate is essentially the same as the thickness of said second electrode and said hole does not overlap said movable electrode in plan view and is not in direct contact with said movable electrode.

11. The semiconductor pressure sensor according to claim 1, wherein said hole does not pass through said movable electrode.

* * * * *